(12) United States Patent
Albaugh et al.

(10) Patent No.: US 9,441,086 B2
(45) Date of Patent: Sep. 13, 2016

(54) CURABLE SILICONE COMPOSITIONS, ELECTRICALLY CONDUCTIVE SILICONE ADHESIVES, METHODS OF MAKING AND USING SAME, AND ELECTRICAL DEVICES CONTAINING SAME

(71) Applicant: Dow Corning Corporation, Midland, MI (US)

(72) Inventors: John Albaugh, Freeland, MI (US); Brian Chislea, Auburn, MI (US); Adriana Zambova, Midland, MI (US)

(73) Assignee: DOW CORNING CORPORATION, Midland, MI (US)

( * ) Notice: Subject to any disclaimer, the term of this patent is extended or adjusted under 35 U.S.C. 154(b) by 0 days.

(21) Appl. No.: 14/650,733

(22) PCT Filed: Dec. 13, 2013

(86) PCT No.: PCT/US2013/074868
§ 371 (c)(1),
(2) Date: Jun. 9, 2015

(87) PCT Pub. No.: WO2014/099639
PCT Pub. Date: Jun. 26, 2014

(65) Prior Publication Data
US 2015/0315437 A1 Nov. 5, 2015

Related U.S. Application Data

(60) Provisional application No. 61/739,915, filed on Dec. 20, 2012.

(51) Int. Cl.
*C08K 3/08* (2006.01)
*C09J 9/02* (2006.01)
*C08K 3/04* (2006.01)
*H05K 1/03* (2006.01)
*C08K 9/02* (2006.01)
*C09J 183/04* (2006.01)
*H01B 1/22* (2006.01)
*C08G 77/12* (2006.01)
*C08G 77/14* (2006.01)
*C08G 77/20* (2006.01)

(52) U.S. Cl.
CPC . *C08K 3/08* (2013.01); *C08K 3/04* (2013.01); *C08K 9/02* (2013.01); *C09J 9/02* (2013.01); *C09J 183/04* (2013.01); *H01B 1/22* (2013.01); *H05K 1/0373* (2013.01); *C08G 77/12* (2013.01); *C08G 77/14* (2013.01); *C08G 77/20* (2013.01); *C08K 2003/045* (2013.01); *C08K 2003/0806* (2013.01); *C08K 2201/001* (2013.01); *C09J 2201/602* (2013.01)

(58) Field of Classification Search
None
See application file for complete search history.

(56) References Cited

U.S. PATENT DOCUMENTS

| 4,777,205 A * | 10/1988 | La Scola | C08K 3/04 |
| --- | --- | --- | --- |
| | | | 252/503 |
| 5,075,038 A | 12/1991 | Cole et al. | |
| 5,227,093 A | 7/1993 | Cole et al. | |
| 5,466,302 A | 11/1995 | Carey et al. | |
| 5,611,884 A | 3/1997 | Bearinger | |
| 6,017,587 A | 1/2000 | Kleyer et al. | |
| 6,706,785 B1 | 3/2004 | Fu | |
| 6,902,588 B2 | 6/2005 | Matsuura et al. | |
| 6,971,163 B1 | 12/2005 | Craig et al. | |
| 7,022,266 B1 | 4/2006 | Craig | |
| 7,338,710 B2 | 3/2008 | Kamiya et al. | |
| 8,044,330 B2 | 10/2011 | Inaba | |
| 2007/0213429 A1 | 9/2007 | Cheng et al. | |
| 2009/0235972 A1 | 9/2009 | Fukushima et al. | |
| 2010/0084001 A1 | 4/2010 | Tsunomura et al. | |
| 2011/0067751 A1 | 3/2011 | Meakin et al. | |
| 2011/0073344 A1* | 3/2011 | Zhang | C08G 59/34 |
| | | | 174/50 |
| 2011/0126878 A1 | 6/2011 | Hacke et al. | |
| 2011/0147672 A1 | 6/2011 | Yang et al. | |
| 2014/0332072 A1 | 11/2014 | Beaucarne et al. | |
| 2014/0345685 A1 | 11/2014 | Albaugh et al. | |
| 2014/0370311 A1 | 12/2014 | Boulord et al. | |

FOREIGN PATENT DOCUMENTS

| JP | 2004-027134 A | 1/2004 |
| --- | --- | --- |
| JP | 2005162827 A | 6/2005 |
| WO | 2011/101788 A1 | 8/2011 |

OTHER PUBLICATIONS

PCT/US2013/074868 International Search Report dated Apr. 16, 2014.
Beaucarne et al.; Silicone-base electrically conductive adhesives for MWT Modules; MWT Workshop Nov. 21, 2012.

(Continued)

*Primary Examiner* — Robert S Loewe
(74) *Attorney, Agent, or Firm* — Dow Corning Corporation

(57) ABSTRACT

A curable silicone composition containing a curable organosiloxane composition, silver, and at least one electrically conductive metal other than silver, the curable silicone composition being characterizable by a total silver concentration of from 50 to less than 60 weight percent and a thixotropic index that is adjustable from 3 to 10 measured according to TI Test Method while the composition remains curable to an electrically conductive silicone adhesive having a volume resistivity of less than 0.001 Ohm-centimeter measured according to Volume Resistivity Test Method without increasing the total concentration of electrically conductive metal in the curable silicone composition to 72 weight percent or higher, the electrically conductive silicone adhesive, an electrical device comprising the electrically conductive silicone adhesive, and a method of manufacturing the electrical device.

15 Claims, No Drawings

(56) References Cited

OTHER PUBLICATIONS

Li J. et al.; Aspect Ratio and Loading Effects of Multiwall Carbon Nanotubes in Epoxy for Electrically Conductive Adhesive; J Adhesion Sci Tech 2008 v22 No. 14 pp. 271-283.

Montemayor; Electrically Conductive Silicone Adhesive, Proceedings of SMTA International Conference, Sep. 2002.

Stoner et al.; Graphenated carbon nanotubes for enhanced electrochemical double layer capacitor performance; Appl. Phys. Lett. 2011 v99 No. 18 pp. 183104-1 to 3.

Zemen Y et al.; Conductive Adhesive Based on Carbon Nanotubes for Solar Cells Interconnection; Photovoltaic Spec Conf PVSC 2012 38th IEEE.

John Albaugh, U.S. Appl. No. 14/775,789, filed Sep. 14, 2015 (Copy Enclosed).

Adriana Zambova, U.S. Appl. No. 14/774,401, filed Sep. 10, 2015 (Copy Enclosed).

English Translation of CN Office Action CN2013-80063552.0 dated Dec. 18, 2015.

* cited by examiner

CURABLE SILICONE COMPOSITIONS, ELECTRICALLY CONDUCTIVE SILICONE ADHESIVES, METHODS OF MAKING AND USING SAME, AND ELECTRICAL DEVICES CONTAINING SAME

CROSS REFERENCE TO RELATED APPLICATIONS

This application is a U.S. national stage filing under 35 U.S.C. §371 of PCT Application No. PCT/US13/74868 filed on Dec. 13, 2013, currently pending, which claims the benefit of U.S. Provisional Patent Application No. 61/739,915 filed Dec. 20, 2012, under 35 U.S.C. §119 (e). PCT Application No. PCT/US13/74868 and U.S. Provisional Patent Application No. 61/739,915 are hereby incorporated by reference.

Inventions described herein include curable silicone compositions, electrically conductive silicone adhesives, methods of making and using the compositions and adhesives, and electrical devices containing the compositions and adhesives.

One approach to electrically interconnecting components of an electrical device is to use an electrically conductive adhesive (ECA). The ECA binds the components together and facilitates transfer of electric current between them via the ECA during operation of the electrical device. A wide variety of electrical components could employ ECAs.

An ECA generally comprises electrically conductive metal particles dispersed in a non-conductive binder matrix at a concentration above their percolation threshold. Percolation threshold is the minimum concentration of the metal particles in the ECA that is necessary for conduction of electric current through the ECA. Just below the percolation threshold, a distinct cutoff of electric current is reached. The cutoff is at a concentration of metal particles that no longer form a continuous path for the current through the binder matrix. For example, silver-based curable silicone precursor compositions typically have a minimum of 70 weight percent (wt %) of silver for satisfactory electrical performance. Reducing the concentration of silver, which is expensive, below that minimum has led in the past to an unsatisfactory gain in volume resistivity. So based on actual formulations, the percolation threshold of silver, i.e., the minimum concentration of silver, for producing a volume resistivity below 0.001 Ohm-centimeter in a silicone binder matrix could be expected to be about 70 wt %.

In addition, the ECA should have a volume resistivity compatible with its application. Volume resistivity ($\rho$) quantifies how strongly a material opposes the flow of electric current therethrough.

The typical ECA is prepared by curing a curable precursor composition comprising the metal particles widely dispersed in a curable binder material. Wide varieties of curable binder materials and other ingredients have been used to make different curable precursor and ECA compositions. Such compositions have different chemical, electrical, magnetic, manufacturing, mechanical, optical, physical, repairability, and/or thermal properties. For example, ECA compositions containing different types of metal particles and/or binder matrix materials will have different percolation thresholds and different volume resistivities from each other. Other composition properties will differ also. Ingredients used to thicken a curable precursor composition tend to increase volume resistivity in the resulting ECA.

Artisans have made different curable precursor compositions and ECAs. Examples of curable precursor compositions and ECAs are mentioned in U.S. Pat. No. 5,075,038 to R. L. Cole et al; U.S. Pat. No. 5,227,093 to R. L. Cole et al.; JP 2004-027134 A to S. Miyazaki; U.S. Pat. No. 8,044,330 B2 to A. Inaba; and WO 2011/101788 A1 to Kleine Jäger, et al.

We (the present inventors) found problems with prior art curable precursor compositions and resulting ECAs. For instance, the prior art does not teach how to achieve a curable precursor composition wherein rheology of the composition could be adjusted over a wide range to accommodate different application requirements for making electrical devices and while the volume resistivity of the resulting ECA could be maintained below 0.001 Ohm-centimeter, wherein the rheology adjustment is made without increasing the total concentration of metal particles in the composition above a relatively low maximum concentration. Such adjustable compositions would be useful for developing different curable precursor formulations that meet same or different needs of electrical device manufacturers while retaining the ECA electrical properties needed by device users.

Alternatively or additionally, we found that some prior art ECAs have poor flexibility. Flexible ECAs are beneficial in applications desiring low stress interconnections and enhance durability of electronic devices that are exposed to wide temperature variations. We realized it would be desirable to develop a flexible, curable precursor formulation with adjustable rheology that meets the needs of manufacturing companies while retaining the ECA electrical properties needed by device users.

Our efforts to solve the foregoing rheology and/or durability problems led us to improved curable silicone compositions and silicone ECAs and one or more technical solutions of the foregoing problems that we believe are not taught, suggested or disclosed by the aforementioned art. We believe that attempting to solve the foregoing technical problems with only knowledge of the prior art as a whole would not result in the present invention without an inventive or nonobvious step.

BRIEF SUMMARY OF THE INVENTION

The present invention includes curable silicone compositions, electrically conductive silicone adhesives, methods of making and using the compositions and adhesives, and electrical devices containing the compositions and adhesives. Embodiments include:

A curable silicone composition containing a curable organosiloxane composition, silver, and at least one electrically conductive metal other than silver, the curable silicone composition being characterizable by a total silver concentration of from 50 to less than 60 weight percent and a thixotropic index that is adjustable from 3 to 10 measured according to TI Test Method while the composition remains curable to an electrically conductive silicone adhesive having a volume resistivity of less than 0.001 Ohm-centimeter measured according to Volume Resistivity Test Method without increasing the total concentration of electrically conductive metal in the curable silicone composition to 72 weight percent or higher.

An electrically conductive silicone adhesive composition that is a product of curing the curable silicone composition and is characterizable by a volume resistivity of less than 0.0010 Ohm-centimeter measured according to Volume Resistivity Test Method.

An electrical device comprising first and second electrical components and the electrically conductive silicone adhesive.

A Method of Manufacturing the Electrical Device.

The invention may be used in electrical components, end-user devices, and methods of their manufacture.

DETAILED DESCRIPTION OF THE INVENTION

The Summary and Abstract are incorporated here by reference. The present invention provides the curable precursor composition, the electrically conductive silicone adhesive (ECSA), the electrical device, and the method of manufacturing the electrical device.

"May" confers a choice, not an imperative. "Optionally" means is absent, alternatively is present. "Contact" comprises effective touching, e.g., as for facilitating reaction. The contact may be direct touching. Any reference herein to a Group or Groups of elements or the Periodic Table of the Elements means those of the 2011 edition of the Periodic Table of the Elements promulgated by IUPAC (International Union of Pure and Applied Chemistry). Unless indicated otherwise by specific statement or context (e.g., metal salt or chelate), any reference to a metal, metal alloy, or metal blend herein refers to the metallic (non-ionic, formal oxidation state 0) form of the relevant element(s). All "wt %" (weight percent) are, unless otherwise noted, based on total weight of the ingredients used. Ingredients of each composition, mixture, or other material add up to 100 wt %. Any Markush group comprising a genus and subgenus therein includes the subgenus in the genus, e.g., in Markush group "R is hydrocarbyl or alkenyl," R may be alkenyl, alternatively R may be hydrocarbyl, which includes, among other subgenuses, alkenyl.

As used herein, volume resistivity ($\rho$) and electrical conductivity (K) refer to bulk volume resistivity and bulk electrical conductivity. If a volume resistivity value and electrical conductivity value inadvertently conflict, the volume resistivity value controls.

The "electrically conductive metal" means an element of any one of Groups 1 to 13 of the Periodic Table of the Elements plus tin and lead from Group 14, antimony from Group 15, and lanthanides and actinides, or a metal alloy of any two or more such elements. The element or metal alloy may have a volume resistivity ($\rho$) at 20° C. less than 0.0001 Ohm-centimeter and an electrical conductivity (K) at 20° C. greater than $1 \times 10^6$ Siemens per meter (S/m)). Examples of such elements are silver, copper, gold, aluminum, calcium, molybdenum, zinc, lithium, tungsten, nickel, iron, palladium, platinum, tin, lead, titanium, mercury, and blends thereof. Examples of such metal alloys are brass (a metal alloy of copper and zinc), bronze (a metal alloy of copper and tin), 67Cu33Zn, carbon steel, grain oriented electrical steel, MANGANIN (trademark name for a metal alloy of formula $Cu_{86}Mn_{12}Ni_2$ by Isabellenhutte Heusler GmbH & Co. K G, Dillenburg, Germany), constantin (a metal alloy of 55% copper and 45% nickel), nichrome (a metal alloy of nickel, chromium, and optionally iron), and blends thereof. The total concentration of electrically conductive metal in the curable silicone composition is less than (<) 72 weight percent (wt %), alternatively ≤71 wt %, alternatively ≤70 wt %, all based on weight of the curable silicone composition. The total concentration of electrically conductive metal in the curable silicone composition may be >60 wt %, alternatively >65 wt %, alternatively >66 wt %, alternatively >67 wt %, alternatively 68 wt %, for example from 68.0 to 71.0 wt %, all based on weight of the curable silicone composition.

The "electrically conductive metal filler" means a finely divided form of the electrically conductive metal. The electrically conductive metal filler may be dispersible and form a colloidal suspension in the curable organosiloxane composition, the ECSA, or both.

The curable silicone composition contains the curable organosiloxane composition, silver, and at least one electrically conductive metal other than silver. For example the curable silicone composition may comprise a blend of the following ingredients: a hydrocarbon vehicle; a curable organosiloxane composition; and electrically conductive filler consisting essentially of a combination of silver particles, silver-coated core particles, and carbon nanotubes; wherein the total concentration of all the ingredients is 100.0 weight percent of the curable silicone composition. The adjusting of thixotropic Index may be accomplished by varying concentration of one of the ingredients or ratio of amounts of two of the ingredients while keeping total silver concentration in the range of from 50 to less than 60 wt % (e.g., 49.5 to 59.4 wt %) and total concentration of electrically conductive metal below 72 wt %. The electrically conductive metal other than silver may be: any one metal of copper, gold, aluminum, calcium, molybdenum, zinc, lithium, tungsten, nickel, iron, palladium, platinum, tin, lead, titanium, and mercury; or any one metal alloy of brass, bronze, 67Cu33Zn, carbon steel, grain oriented electrical steel, MANGANIN, constantin, and nichrome; or a physical blend of any two or more of copper, gold, aluminum, calcium, molybdenum, zinc, lithium, tungsten, nickel, iron, palladium, platinum, tin, lead, titanium, mercury, brass, bronze, 67Cu33Zn, carbon steel, grain oriented electrical steel, MANGANIN, constantin, and nichrome. Alternatively, the electrically conductive metal other than silver may lack copper and gold such that the electrically conductive metal other than silver may be: any one metal of aluminum, calcium, molybdenum, zinc, lithium, tungsten, nickel, iron, palladium, platinum, tin, lead, titanium, and mercury; or any one metal alloy of carbon steel, grain oriented electrical steel, and nichrome; or a physical blend of any two or more of aluminum, calcium, molybdenum, zinc, lithium, tungsten, nickel, iron, palladium, platinum, tin, lead, titanium, mercury, carbon steel, grain oriented electrical steel, and nichrome. Alternatively, the electrically conductive metal may lack copper, gold and aluminum such that the electrically conductive metal other than silver may be: any one metal of calcium, molybdenum, zinc, lithium, tungsten, nickel, iron, palladium, platinum, tin, lead, titanium, and mercury; or any one metal alloy of carbon steel, grain oriented electrical steel, and nichrome; or a physical blend of any two or more of calcium, molybdenum, zinc, lithium, tungsten, nickel, iron, palladium, platinum, tin, lead, titanium, mercury, carbon steel, grain oriented electrical steel, and nichrome. For example, the electrically conductive metal other than silver may be: any one metal of zinc, tungsten, nickel, iron, tin, lead, and titanium, alternatively zinc, alternatively tungsten, alternatively nickel, alternatively iron, alternatively tin, alternatively lead, alternatively titanium.

In some embodiments the curable silicone composition is a curable silicone composition comprising a blend of the following ingredients: A hydrocarbon vehicle at a concentration of from 4.0 to 20 weight percent based on weight of the curable silicone composition, wherein the hydrocarbon vehicle is characterizable by a boiling point from 100 to 360 degrees Celsius; A curable organosiloxane composition at a concentration of from 10 to 40 weight percent based on weight of the curable silicone composition; and Electrically conductive filler consisting essentially of a combination of silver particles, silver-coated core particles, and carbon nanotubes, wherein the total concentration of silver is from 50 to less than 60 weight percent and carbon nanotubes are at a concentration of from greater than 0 to 5.0 weight percent, all based on weight of the curable silicone composition; Wherein the total concentration of all the ingredients of the curable silicone composition is 100.0 weight percent; Wherein the curable silicone composition is characterizable by a Thixotropic Index($\eta_1/\eta_{10}$) of at least 3 measured according to TI Test Method described later; and Wherein the curable silicone composition is characterizable by a volume resistivity less than 0.0010 Ohm-centimeter measured according to Volume Resistivity Test Method.

The hydrocarbon vehicle is a liquid collection of molecules wherein each molecule consists of carbon and hydrogen atoms, including one or more than one isotopic forms of carbon and hydrogen atoms, respectively. Each molecule has carbon-carbon bonds wherein each carbon-carbon bond independently is a single, double, triple, or aromatic bond. Each molecule independently may be a saturated hydrocarbon, unsaturated hydrocarbon, aromatic hydrocarbon, or a combination of any two or three thereof. Each molecule independently may be acyclic or cyclic, or a combination of acyclic and cyclic portions. Each acyclic molecule or portion independently may be branched or unbranched. Each cyclic molecule or portion independently may be aromatic or non-aromatic. Additionally, each cyclic molecule or portion independently may be monocyclic or polycyclic, including bicyclic or tricyclic. Each polycyclic molecule or portion may be simple (separate rings that do not share atoms) or complex (having at least two rings that share at least one atom). Examples of complex polycyclic molecules are bridged, spirocyclic, and fused polycyclic. Each ring of the polycyclic molecule independently may be aromatic or non-aromatic. The hydrocarbon vehicle may be from any one or more of the following classes: alkane, alkene, alkyne, cycloalkane, cycloalkene, cycloalkyne, and aromatic hydrocarbons. The hydrocarbon vehicle may be a mixture of any two or more hydrocarbons of the same or different classes. The mixture of hydrocarbons of the same class may be a mixture of alkanes such as a mixture of unbranched alkanes (normal-alkanes) or a mixture of branched alkanes (e.g., an isoalkanes mixture, neo-alkanes mixture, or tertiary-alkanes mixture). For example, the isoalkanes mixture may comprise at least two of ($C_9$-$C_{12}$)isoalkanes, at least two of ($C_{12}$-$C_{16}$)isoalkanes or at least two of ($C_{16}$-$C_{22}$)isoalkanes. The mixture of hydrocarbons from different classes may be a mixture of alkanes and aromatic hydrocarbons or a mixture of alkanes and alkenes.

The hydrocarbon vehicle is also characterizable by a boiling point of at least 100 degrees Celsius (° C.), alternatively from 100 to 360° C. The particular boiling point of the hydrocarbon vehicle is not critical so long as it is above 100° C. and yet not so high that the hydrocarbon vehicle could not be substantially removed during curing of the curable silicone composition and/or thereafter. The "substantially removed" means removal of at least 50 volume percent (vol %), alternatively at least 75 vol %, alternatively at least 90 vol %, alternatively at least 98 vol %, alternatively at least 99 vol % removed, based on starting volume of the hydrocarbon vehicle and an amount such that the ECSA has <5 weight percent (wt %), alternatively <4 wt %, alternatively <3 wt %, alternatively <2 wt %, alternatively <1 wt % of hydrocarbon vehicle after curing has been stopped or completed. The amount of hydrocarbon vehicle remaining in the ECSA after curing may be equal to (weight of the hydrocarbon vehicle used in the curable silicone composition) minus the weight lost during curing. The weight lost during curing may equal weight of the curable silicone composition before curing minus weight of the ECSA. Alternatively, thermal gravimetric analysis (TGA) may be employed to measure weight change upon heating and pyrolysis gas chromatograph-mass spectrometry may be employed to quantitatively analyze (identify and quantify) materials that have left the curable silicone composition or ECSA prepared therefrom during curing of the former. The hydrocarbon vehicle can be removed without degrading the ECSA to a degree of decomposition whereat the ECSA would not be able to meet its electrical, adhesive, or both limitations described herein.

Additionally, an embodiment of the hydrocarbon vehicle with a particular boiling point or boiling point range may be used to accommodate beneficial curing conditions for curing the curable silicone composition. For example, the boiling point or boiling point range temperature range may beneficially facilitate shrinkage of bulk volume of material during curing such that the bulk volume of the curable silicone composition immediately prior to curing is higher than the bulk volume of the resulting ECSA after curing. The shrinkage may advantageously be at a relatively slow and steady rate such that packing of the electrically conductive filler in the curable silicone composition is improved (i.e., increased, giving denser packing), resulting in lower volume resistivity and higher electrical conductivity of the ECSA than would be obtained with a comparative ECSA having a hydrocarbon vehicle having a boiling point less than 100° C., especially less than 80° C., alternatively <60° C., alternatively <50° C. The rate of shrinkage may be adjusted to improve (i.e., increase) packing of the electrically conductive filler in the ECSA.

For most applications, a maximum boiling point (i.e., an end boiling point) of 360° C. is sufficient for the hydrocarbon vehicle. When the hydrocarbon vehicle is a mixture of different hydrocarbon molecules that have different boiling points, the hydrocarbon vehicle may be characterizable by an initial boiling point of lowest boiling molecules and an end boiling point of highest boiling molecules. For example, the hydrocarbon vehicle may have an initial boiling point greater than 150° C. and an end boiling less than 300° C.; alternatively an initial boiling point of greater than 210° C. and an end boiling point of less than 270° C.; alternatively an initial boiling point of >160° C. and an end boiling point <205° C.; alternatively an initial boiling point of >210° C. and an end boiling point <270° C.; alternatively an initial boiling point of >270° C. and an end boiling point <355° C.

The hydrocarbon vehicle may be present in the curable silicone composition at a concentration of from 4.0 to 20 wt %, alternatively from 5 to 20 wt %, alternatively from 5 to 15 wt %, alternatively from 5 to 14 wt %, alternatively from 6 to 11 wt %, all based on total weight of the curable silicone composition. Too little wt % of hydrocarbon vehicle may result in volume resistivity of the resulting ECSA being greater than 0.0010 Ohm-cm.

The phrase "electrically conductive filler consisting essentially of silver particles, silver-coated core particles, and carbon nanotubes" means the curable silicone composition and ECSA has less than 0.2 wt %, alternatively <0.1 wt %, alternatively <0.10 wt %, alternatively <0.05 wt %, alternatively <0.01 wt % of electrically conductive filler other than the combination of silver particles, silver-coated core particles, and carbon nanotubes. The curable silicone composition and ECSA may lack or be free of (i.e., may contain 0.00 wt %) of electrically conductive filler other than the combination. The electrically conductive filler may have an aspect ratio ranging from 1:1 (approximately spherical) to 3,000:1.

The "silver particles" mean a finely divided solid form of the element having atomic number 47 (Ag), wherein the silver particles overall have at least 90 atomic percent (at %) Ag, alternatively >95 at % Ag, alternatively >98 at %, alternatively >99.99 at % Ag. The concentration of the silver particles in the curable silicone composition may be from 40 to 58 wt % (e.g., an embodiment of aspect 1 described later), alternatively from 42 to 55 wt %, alternatively from 45 to 55 wt %, alternatively from 48 to 52 wt %, alternatively from 49 to 51 wt %, all based on weight of the curable silicone composition.

The "silver-coated core particles" mean a finely divided core-shell composite wherein the core is a solid or liquid form of an inner support material that is not silver and the shell is a coating or film of the element having atomic number 47 (Ag), wherein the shell covers the inner support material. The inner support material may be a liquid having a boiling point >300° C. (e.g., mercury), alternatively a solid. In each silver-coated core particle, the inner support material may be a single particle, alternatively a cluster or agglomerate of a plurality of particles. The inner support material may be electrically conductive or electrically non-conductive (insulating). The electrically non-conductive inner support material may be silica glass (e.g., soda-lime-silica glass or borosilicate glass), diamond polymorph of carbon, silica, organic polymer, organosiloxane polymer, or a ceramic. The silica glass particles may be solid or hollow. The electrically conductive inner support material may be any non-silver, electrically conductive particles such as solid metal particles other than Ag particles, solid metal alloy particles lacking silver, particles of non-diamond allotropes of carbon, or a mixture thereof. Therefore, the inner support material may be aluminum; silica glass; carbon; a ceramic; copper; iron; lithium; molybdenum; nickel; organic polymer; palladium; platinum; silica; tin; tungsten; zinc; or a metal alloy of any two or more of aluminum, copper, iron, lithium, molybdenum, nickel, palladium, platinum, tin, tungsten, and zinc; or a physical blend of any two or more of aluminum; silica glass; carbon; a ceramic; copper; iron; lithium; molybdenum; nickel; organic polymer; palladium; platinum; silica; tin; tungsten; zinc; and the metal alloy. The material of the inner support material may be the same as or different than the non-Ag material of the electrically conductive metal filler as described herein. The concentration of silver in the Ag-coated core particles may be from 2 to 59 wt % (e.g., an embodiment of aspect 1 described later), alternatively from 2 to 58 wt %, alternatively from 10 to 45 wt %, alternatively from 12 to 43 wt %, alternatively from 28 to 42 wt %, all based on weight of the Ag-coated core particles. Examples of Ag-coated core particles are silver-coated nickel particles, wherein the core or inner support material is nickel. Examples of silver-coated nickel particles are Ag-coated nickel particles having 15 wt % Ag (Ag/Ni-15), 30 wt % Ag (Ag/Ni-30), or 40 wt % Ag (Ag/Ni-40), based on weight of the Ag-coated nickel particles. The concentration of the Ag-coated core particles in the curable silicone composition may be from 12 to 28 wt % (e.g., an embodiment of aspect 1 described later), alternatively from 15 to 25 wt %, alternatively from 16 to 22 wt %, alternatively from 16 to 20 wt %, alternatively from 17 to 20 wt %, all based on weight of the curable silicone composition. As an example of calculating the contribution of Ag content in the curable silicone composition due to the Ag-coated core particles, when the Ag-coated core particles in the curable silicone composition consist of Ag-coated nickel particles having 40 wt % silver (i.e., Ag/Ni-40) based on weight of the Ag-coated nickel particles, and the Ag-coated nickel particles (i.e., Ag/Ni-40) are present in the curable silicone composition at 20 wt % based on weight of the curable silicone composition, the Ag-coated nickel particles would contribute 8.0 wt % Ag (20 wt %×0.40=8.0 wt % Ag) in the curable silicone composition. The remainder of Ag in such a curable silicone composition would be contributed by the Ag particles. For example, if the silver particles are present in the curable silicone composition at 47 wt % and the Ag/Ni-40 particles at 20 wt %, both based on weight of the curable silicone composition, then the total concentration of silver in the curable silicone composition would equal 55 wt % Ag (47 wt %+8.0 wt %=55 wt %).

If there is any inadvertent conflict herein between the amount of silver calculated from the quantities of the silver particles and silver-coated particles (accounting for the concentration of silver in the latter) and the total concentration of silver in the curable silicone composition, the total concentration of silver in the curable silicone composition controls such that the quantities of silver particles and silver-coated particles may be adjusted, if necessary, so as to satisfy the total concentration of silver in the curable silicone composition. The total concentration of silver in the curable silicone composition may be from 49.6 to <60 wt % (e.g., an embodiment of aspect 1 described later), alternatively from 50.0 to 59.4 wt %, alternatively from 50.7 to 59.4 wt %, alternatively from 54 to 59.0 wt %, alternatively from 54.0 to 59.0 wt %, alternatively from 56.0 to 58.0 wt %, for example from 52.9 to 58.1 wt %, all based on weight of the curable silicone composition. The curable silicone composition may lack silver from any source other than the silver particles and Ag-coated core particles. Advantageously, the concentration of silver in the curable silicone composition may be beneficially limited to reduce costs without losing the beneficial electrical conductivity and volume resistivity properties of the resulting ECSA.

The silver particles may be characterizable by an electrical conductivity (K) of $1\times10^6$ S/m, alternatively K≥$1.0\times10^7$ S/m, alternatively K≥$5.0\times10^7$ S/m, alternatively K≥$6.0\times10^7$ S/m. The Ag-coated particles (e.g., Ag/Ni-40 particles) may be characterizable by an electrical conductivity (K) of ≥$1\times10^6$ S/m, alternatively K≥$2.0\times10^6$ S/m, alternatively K≥$5.0\times10^6$ S/m, alternatively K ≥$1.0\times10^7$ S/m. The silver particles and the Ag-coated core particles independently may be in the shape of cuboidals, flakes, granules, irregulars, rods, needles, powders, spheres, or a mixture of any two or more of cuboidals, flakes, granules, irregulars, rods, needles, powders, and spheres. The silver particles may have a median particle size of from 0.005 to 20 microns (μm). The silver particles may be characterizable by a maximum particle size of 500 μm, alternatively 200 μm, alternatively 100 μm, alternatively 50 μm, alternatively 30 μm; and a minimum particle size of 0.0001 μm, alternatively 0.0005 μm, alternatively 0.001 μm. The Ag-coated core particles may have a median particle size of from 5 to 100 μm. The Ag-coated core particles may be characterizable by a maximum particle size of 1 millimeter (mm), alternatively 100 μm, alternatively 50 μm, alternatively 10 μm, alternatively 1 μm, alternatively 500 nanometers (nm); and a minimum particle size of >0.001 μm, alternatively 0.01 μm, alternatively 0.1 μm. The particle sizes may be determined by particle size distribution analysis and reported as a median particle size in μm (D<50), alternatively as the diameter in μm below which 10% (D10), 50% (D50) and 90% (D90) of the cumulative particle size distribution is found. Prior to preparing the curable silicone composition, the particle size may be determined with a sample of Ag particles or Ag-coated core particles in dry form or dispersed in a dispersant (e.g., water) using laser diffraction or particle size analyzer instrument. For example, the MALVERN MASTERSIZER S particle size analyzer instrument (Malvern Instruments, Malvern, Worcestershire, UK) may be used with particles having a size in the range of from 300 nm to 1000 μm; and the MICROTRAC NANOTRAC UPA150 particle size analyzer instrument (Microtrac, Inc., Montgomeryville, Pa., USA) may be used with particles having a size in the range of from 5 nm to 4 μm. Atomic force microscopy (AFM), scanning electron microscopy (SEM) or transmission electron microscopy (TEM) may be used to measure the particle sizes of Ag particles and/or Ag-coated core particles after the particles have been dispersed in the curable silicone composition or after curing same to the ECSA. Unless stated otherwise herein, any particle size measurement is for particles prior to preparing the curable silicone composition containing same.

The silver particles (e.g., silver flakes) and the Ag-coated core particles independently may be surface treated. For example, such particles may be surface treated to improve (i.e., increase) "wetability" by the curable organosiloxane composition and/or dispersability in the curable silicone composition, ECSA, or both. The surface treatment may comprise contacting the particles with a chemical substance such as an acid, base, compatibilizer, lubricant, or processing aid. The chemical substance may be aqueous sodium hydroxide, a ($C_4$-$C_{28}$)carboxylic acid or ester (e.g., a fatty acid or fatty acid ester), the hydrocarbon vehicle, a silicon-containing compound, or sulfuric acid. The silicon-containing compound may be an organochlorosilane, organosiloxane, organodisilazane, organoalkoxysilane. The lubricant may be used to treat the silver particles during a milling process of making silver flakes from silver powder to prevent the silver powder from cold welding or forming agglomerates. The chemical substance may, alternatively may not, be removed from the silver particles and/or the Ag-coated core particles before the particles are mixed with other ingredients of the curable silicone composition. Even if the treated particles are washed with solvent after the treating process, some chemical substances such as the lubricant or compatibilizer may remain chemisorbed on the surface of the particles.

The carbon nanotubes used in the present invention may be single-walled carbon nanotubes; multi-walled carbon nanotubes; derivatized single-walled carbon nanotubes; derivatized multi-walled carbon nanotubes; or a mixture of any two or more of the single-walled carbon nanotubes, multi-walled carbon nanotubes, derivatized single-walled carbon nanotubes, and derivatized multi-walled carbon nanotubes. The carbon nanotubes may be characterizable by an electrical conductivity (K) of 1 S/m. The "single-walled carbon nanotube" (SWCNT) is an allotrope of carbon having single cylindrical structure (i.e., cylindrical graphene). The "multi-walled carbon nanotubes" (MWCNT) is an allotrope of carbon having multiple sheets of graphite (graphene sheets) in form of coaxial (concentric) cylindrical structures (cylinder within cylinder ("Russian Doll model")) or having a single sheet of graphite (graphene sheet) rolled around itself to form a rolled scroll-like structure ("Parchment model"), or a combination thereof. The CNT may or may not have a "bamboo-like" structure, which may be prepared by chemical vapor deposition pyrolysis of melamine under argon atmosphere at 800 to 980° C. The "derivatized carbon nanotube" is a graphenated carbon nanotube, a functional group-containing carbon nanotube, or a combination structure thereof. The functional group-containing CNT has at least one heteroatom-containing moiety that is covalently bonded to a carbon atom of the carbon nanotube wall wherein the moiety has at least one heteroatom that is O, N, S, P, or halogen (F, Cl, Br, or I). Examples of such functional groups are —$NO_3$, —$SO_3H$, —$PO_3H$, —OH, —COOH, and —$NH_2$. The "graphenated carbon nanotube" is a hybrid structure comprising a graphitic foliate covalently bonded to a sidewall of a SWCNT or MWCNT. The functional group-containing carbon nanotubes may be obtained from a commercial supplier thereof or prepared according to any suitable method. Examples of the suitable method comprise exposing a starting carbon nanotube with a chemical substance, an environmental condition, or any combination thereof so as to install the at least one functional group on a carbon atom of the starting carbon nanotubes to give the functional group-containing carbon nanotubes. The chemical substance may be an aqueous base such as aqueous sodium hydroxide or aqueous acid such as sulfuric acid, nitric acid, an oxidant (e.g., oxygen gas), or a mixture thereof. The environmental condition may be heat treatment (e.g., 900° to 1,100° C. for from 1 to 60 minutes), inert atmosphere, or any combination thereof. The graphenated carbon nanotube may be obtained from a commercial supplier thereof or prepared according to any suitable method. Examples of the suitable method comprise any one of the methods of Yu, K., et al. (*Carbon Nanotube with Chemically Bonded Graphene Leaves for Electronic and Optoelectronic Applications*, J. Phys. Chem. Lett., 2011; 13(2): 1556-1562); Stoner, B. R. et al. (*Graphenated carbon nanotubes for enhanced electrochemical double layer capacitor performance*, Appl. Phys. Lett., 2011; 99(18): 183104-1 to 183104-3); and Hsu, H-C et al. (*Stand-up structure of graphene-like carbon nanowalls on CNT directly grown on polyacrylonitrile-based carbon fiber paper as supercapacitor*, Diamond and Related Materials, 2012; 25:176-179). Examples of the combination structure are —$NO_3$, —$SO_3H$, —$PO_3H$, —OH, —COOH, or —$NH_2$ functionalized graphenated carbon nanotubes such as wherein the —$NO_3$, —$SO_3H$, —$PO_3H$, —OH, —COOH, or —$NH_2$ groups comprise from 0.01 to 5 wt %, alternatively from 0.1 to 3 wt %, alternatively from 0.5 to 2 (e.g., 1 wt %) of the weight of the combination structure.

Each of the different types of carbon nanotubes particles independently may be characterizable by a maximum outer diameter of 10 μm, alternatively 1 μm, alternatively 500 nm, alternatively 300 nm, alternatively 200 nm, alternatively 100 nm, alternatively 50 nm; and a minimum outer diameter of 1 nm, alternatively 2 nm, alternatively 5 nm, alternatively 8 nm, alternatively 10 nm, alternatively 15 nm, alternatively 25 nm. The carbon nanotubes particles may be characterizable by a maximum length of 1 mm, alternatively 500 μm, alternatively 300 μm, alternatively 150 μm, alternatively 100 μm, alternatively 50 μm, alternatively 25 μm; and a minimum length of 0.1 μm, alternatively 1 μm, alternatively 5 μm, alternatively 10 μm, alternatively 20 μm. Raman spectroscopy, AFM, SEM or TEM, e.g., TEM, may be used to measure the diameter and length.

The carbon nanotubes may be dispersed in the curable organosiloxane composition of the curable silicone composition by any suitable means such as mixing, sonication, or a combination thereof. The concentration of the carbon nanotubes in the curable silicone composition may be from >0 to 5.0 wt % (e.g., an embodiment of aspect 1 described later), alternatively from 0.01 to 4.9 wt %, alternatively from 0.05 to 3.9 wt %, alternatively from 0.1 to 2.9 wt %, alternatively from 0.4 to 2.5 wt %, alternatively from 0.6 to 2.3 wt %, alternatively from 0.7 to 2.2 wt %, for example from 0.4 to 2.2 wt % or from 0.50 to 2.0 wt %, all based on weight of the curable silicone composition. Advantageously, the concentration of the carbon nanotubes in the curable silicone composition may be varied within the foregoing ranges to adjust rheology such as thixotropic index while beneficially maintaining volume resistivity of the resulting ECSA below 0.001 Ohm-cm without adding another highly electrically conductive metal or noble metal filler such as copper and gold metals and while maintaining the total concentration of silver in the economically attractive range of from 50 to <60 wt % in the curable silicone composition. Concentration of hydrocarbon vehicle below 4 wt %, or concentration of hydrocarbon vehicle below 4 wt % and absence of carbon nanotubes, or concentration of hydrocarbon vehicle below 4 wt % and replacement of carbon nanotubes with a different non-metallic filler in the curable silicone composition, may result in volume resistivity of the resulting ECSA being >0.001 Ohm-cm, alternatively >0.1 Ohm-cm, alternatively >1 Ohm-cm.

The electrically conductive filler other than the combination of silver particles, silver-coated core particles, and carbon nanotubes means any other solid particles characterizable by volume resistivity ($\rho$) at 20° C. less than 0.001 Ohm-centimeter and electrical conductivity (K) at 20° C. greater than $1 \times 10^5$ Siemens per meter (S/m)). These other solid particles include solid metal particles other than silver particles, solid metal alloy particles other than silver alloy particles, particles of non-diamond allotropes of carbon other than carbon nanotubes, and mixtures thereof. The solid metal particles other than silver particles include, but are not limited to, particles of the electrically conductive metal other than silver described above. For example, the solid metal particles other than silver particles include particles of copper, gold, aluminum, calcium, tungsten, zinc, nickel, lithium, iron, platinum, tin, lead, titanium, and germanium. The solid metal alloy particles other than silver alloy particles include, but are not limited to, particles of carbon steel (e.g., 1010), grain oriented electrical steel, MANGANIN, constantan, stainless steel, and nichrome. The non-diamond allotropes of carbon other than carbon nanotubes include amorphous, fibrillar, glassy (vitreous), and graphitic polymorphs of carbon, and do not include (exclude) the diamond polymorph of carbon. The non-diamond allotropes of carbon other than carbon nanotubes also include amorphous, fibrillar, glassy, and graphitic polymorphs of carbon wherein the particles have been derivatized with functional groups (e.g., —COON or —NH$_2$) and/or treated with a chemical substance (aqueous base such as aqueous sodium hydroxide or aqueous acid such as sulfuric acid, nitric acid, or a mixture thereof) or an environmental condition (e.g., oxidizing and/or heat treatment), or any combination thereof.

The "curable organosiloxane composition" may be any curable organosiloxane such as a condensation curable organosiloxane, free radical curable organosiloxane, or hydrosilylation-curable organosiloxane. The "silicone" includes linear and branched organosiloxanes. The main advantages of the present invention may be achieved with embodiments employing any curable organosiloxane.

Depending on its reactive functional groups, curing or rate of curing of the curable organosiloxane composition may be enhanced by contacting the curable organosiloxane composition with a metal-containing catalyst, heat, ultraviolet (UV) light, O$_2$, peroxides, water (e.g., water vapor in air), or a combination thereof. The metal of the metal-containing catalyst may be Sn, Ti, Pt, or Rh. The condensation curable organosiloxane may be hydroxy-functionalized and/or alkoxy-functionalized. Curing or curing rate of the condensation curable organosiloxane may be enhanced by moisture, heat, or heat and moisture. The free radical curable organosiloxane may be alkenyl-functionalized (e.g., vinyl) and/or alkynyl-functionalized. Curing or curing rate of the free radical curable organosiloxane may be enhanced by UV light or peroxides, heat, or both. The hydrosilylation-curable organosiloxane may be alkenyl functionalized (e.g., vinyl) and Si—H functionalized. Curing or curing rate of the hydrosilylation-curable organosiloxane may be enhanced by a hydrosilylation catalyst (e.g., a Pt catalyst), heat, or both hydrosilylation catalyst and heat.

Each organosiloxane molecule comprises silicon, carbon, hydrogen, and oxygen atoms. As used in "organosiloxane" the term "organo" means a hydrocarbyl, heterohydrocarbyl, or organoheteryl, which groups are collectively referred to herein as organogroups. Each organogroup may be heterohydrocarbyl, alternatively organoheteryl, alternatively hydrocarbyl. The hydrocarbyl, heterohydrocarbyl, and organoheteryl groups are described later. Each organogroup may have from 1 to 20 carbon atoms, e.g., a ($C_1$-$C_{20}$) hydrocarbyl. Each organosiloxane molecule may contain only unsubstituted hydrocarbyl groups (i.e., contain only silicon, carbon, hydrogen atoms bonded to carbon atoms, and oxygen atoms). Alternatively, one or more organosiloxane molecules may be substituted with heterohydrocarbyl, organoheteryl, or a reactive functional group. Each reactive functional group independently may be the alkenyl or alkynyl moiety; Si—H moiety; Si—OH moiety; Si—OR$^x$ moiety, wherein Rx is ($C_1$-$C_{10}$)hydrocarbyl, —C(O)($C_1$-$C_{10}$)hydrocarbyl; or —N=CR$^1$R$^2$ moiety, wherein each of R$^1$ and R$^2$ independently is ($C_1$-$C_{10}$)hydrocarbyl or R$^1$ and R$^2$ are taken together to form a ($C_2$-$C_{10}$)hydrocarbylene.

Each organosiloxane molecule independently may comprise a silicon-containing base polymer having a linear, branched, cyclic, or resinous structure. For example, each silicon-containing base polymer independently may have a linear structure, alternatively a branched structure, alternatively a cyclic structure, alternatively a resinous structure. Each silicon-containing base polymer independently may be a homopolymer or copolymer. Each silicon-containing base polymer independently may have one or more of the reactive functional groups per molecule. At least some, alternatively most, alternatively substantially all reactive functional groups react during curing of the curable organosiloxane composition to give the cured organosiloxane. The reactive functional groups independently may be located on the silicon-containing base polymer at terminal, pendant, or terminal and pendant positions. Each organosiloxane molecule of the curable organosiloxane composition may be a single silicon-containing base polymer, alternatively may comprise two or more silicon-containing base polymers differing from each other in at least one of the following properties: structure, viscosity, average molecular weight, siloxane units, and unit sequence.

The condensation curable organosiloxane may be a diorganosiloxane compound having on average per molecule at least 1 hydroxyl moiety, or a mixture of the diorganosiloxane compound and an organohalogensilicon compound having on average per molecule at least one halogen atom (e.g., Cl, F, Br, or I). Alternatively, the condensation curable organosiloxane may be a mixture of the component (A) and component (B) described in U.S. Pat. No. 6,534,581 B1, at column 3, line 3, to column 4, line 63. (Components (A) and (B) are different than ingredients (A) and (B) described later herein.) The present invention, however, is not limited to this condensation curable organosiloxane.

As used in "diorganosiloxane compound" (whether condensation curable or not) the term "diorgano" means a molecule having at least one difunctional (D) unit of formula $R_2SiO_{2/2}$; wherein each R independently is an organogroup. Examples of diorganosiloxane compounds are a polydimethylsiloxane, wherein each organo group of the D units is methyl; poly(ethyl,methyl)siloxane wherein the organo groups of the D units are methyl and ethyl groups as in the D unit of formula $CH_3(CH_3CH_2)SiO_{2/2}$; and poly(methyl,phenyl)siloxane wherein the organo groups of the D units are methyl and phenyl groups as in the D unit of formula $CH_3(C_6H_5)SiO_{2/2}$. The diorganosiloxane compound may have all D units as in a diorganocyclosiloxane compound. Typically, the diorganosiloxane compound further has at least one M, Q, and/or T units. The reactive functional group(s) may be on any one or more of the D units and/or one or more of any M and/or Q units.

The condensation curable organosiloxane may be a diorganosiloxane compound having on average per molecule at least 1 alkenyl moiety. Alternatively, the free radical curable organosiloxane may be the oligomer, polymer, or product of curing the polymerizable monomer described in U.S. Pat. No. 7,850,870 B2, at column 5, line 28, to column 12, line 9. The present invention, however, is not limited to this free radical curable organosiloxane.

Typically, the curable silicone composition and its curable organosiloxane composition comprises the hydrosilylation-curable organosiloxane and after curing the ECSA comprises an at least partially hydrosilylation cured organosiloxane. The present invention, however, is not limited to using hydrosilylation-curable/cured organosiloxanes.

Before at least partial curing, a first embodiment of the hydrosilylation-curable organosiloxane typically comprises ingredients (A) and (C) when ingredient (A) contains a Si—H moiety. Alternatively a second embodiment of the hydrosilylation-curable organosiloxane typically comprises ingredients (A), (B) and (C) when ingredient (A) contains or lacks a Si—H moiety. Ingredients (A) to (C) are: (A) at least one diorganosiloxane compound having an average of at least one unsaturated carbon-carbon bonds per molecule; (B) an organohydrogensilicon compound having an average of at least one Si—H moieties per molecule; and (C) a hydrosilylation catalyst. Ingredient (B) may function as a chain extender or crosslinker for extending or crosslinking ingredient (A).

As used in "organohydrogensilicon compound" (whether hydrosilylation curable or not) the term "organohydrogen" means a molecule having at least one difunctional unit of formula RHSi, wherein R independently is an organogroup. When the organohydrogensilicon compound is an organohydrogensiloxane compound, the molecule has the difunctional (D) unit of formula $RHSiO_{2/2}$; wherein R independently is an organogroup.

During hydrosilylation curing, different molecules of ingredient (A) in the first embodiment, or ingredients (A) and (B) in the second embodiment, react together via hydrosilylation to give the at least partially hydrosilylation cured organosiloxane. The reaction may give substantial curing; alternatively complete curing. The hydrosilylation cured organosiloxane may be substantially cured, alternatively completely cured. Substantially cured means a degree of curing that is at least 90 mole %, alternatively at least 95 mole %, alternatively at least 98 mole % cured based on the limiting ingredient. The degree of curing may be determined by Differential Scanning calorimetry (DSC). A fully cured material would not show an exotherm peak by DSC analysis when a sample of the fully cured material is heated during the DSC measurement. An uncured material that is capable of curing would show an exotherm peak (e.g., indicative of an exothermic event such as a reaction or mixing that generates or releases heat) having a maximum area for the uncured material by DSC analysis when a sample of the uncured material is heated during the DSC measurement. A partially cured material would show an exotherm peak wherein the area thereof would be intermediate between the area of the exotherm peak for the uncured material and the 0 area (no exotherm peak) for the cured material. The proportion of area of the exotherm peak of the partially cured material compared to the area of the exotherm peak of the uncured material would be proportional to the percent curing of the partially cured material. Each diorganosiloxane compound and organohydrogensilicon compound independently may be the same (i.e., have both Si—H and unsaturated carbon-carbon bonds in same molecule), alternatively different. When ingredients (A) and (B) are the same compound, the curing comprises intermolecular hydrosilylations and may also comprise intramolecular hydrosilylations. When ingredients (A) and (B) are different compounds, the curing comprises intermolecular hydrosilylations.

Ingredient (A), the at least one diorganosiloxane compound, is hydrosilylation-curable and may include a single diorganosiloxane compound, or a plurality of different diorganosiloxane compounds. As suggested in the foregoing paragraph, each diorganosiloxane compound may contain, alternatively lack a Si—H moiety. Each diorganosiloxane compound independently may have an average of at least 1, alternatively >1, alternatively 2, alternatively 3, alternatively 5, alternatively 10 unsaturated carbon-carbon bonds per molecule. Each unsaturated carbon-carbon bond independently is C═C (alkenyl) or C≡C (alkynyl). Typically at least one of the unsaturated carbon-carbon bonds is C═C, alternatively all of the unsaturated carbon-carbon bonds are C═C, alternatively at least one of the unsaturated carbon-carbon bonds is C≡C, alternatively all are C≡C, alternatively the unsaturated carbon-carbon bonds are a combination of C═C and C≡C. The diorganosiloxane compound may be an alkynyl siloxane or alkenyl siloxane wherein there are at least one alkynyl or alkenyl groups, respectively, and each of the alkynyl or alkenyl groups may be pending from a carbon, oxygen, or silicon atom. Each alkenyl group independently may have one or more C═C bonds. Each alkenyl may have one C═C and be a $(C_2-C_6)$alkenyl, alternatively $(C_2-C_4)$alkenyl (e.g., vinyl or allyl). The C═C bond in the alkenyl may be internal as in 5-hexen-1-yl or terminal alkenyl as in $H_2C$═$C(H)$—$(C_0-C_6)$alkylene ($H_2C$═$C(H)$—$(C_0)$alkylene is vinyl). The alkynyl and alkenyl groups independently may be located at any interval and/or location in the diorganosiloxane compound such as terminal, pendant, or both terminal and pendant (internal) positions. The diorganosiloxane compound(s) may be a mixture or blend of at least two different diorganosiloxane compounds, so long as ingredient (A) has the average of at least one unsaturated carbon-carbon bonds per molecule. The diorganosiloxane compound may be a diorganocyclosiloxane monomer or a polydiorganosiloxane.

Referring again to ingredient (A), the polydiorganosiloxane may be straight or branched, uncrosslinked or crosslinked and comprise at least two D units. Any polydiorganosiloxane may further comprise additional D units. Any polydiorganosiloxane may further comprise at least one M, T, or Q unit in any covalent combination; alternatively at least one M unit; alternatively at least one T unit; alternatively at least one Q unit; alternatively any covalent combination of at least one M unit and at least one T unit. The polydiorganosiloxane with the covalent combination may be a DT, MT, MDM, MDT, DTQ, MTQ, MDTQ, DQ, MQ, DTQ, or MDQ polydiorganosiloxane. Ingredient (A) may be a mixture or blend of polydiorganosiloxanes, e.g., a mixture of MDM and DT molecules. Known symbols M, D, T, and Q, represent the different functionality of structural units that may be present in a siloxane (e.g., a silicone), which comprises siloxane units joined by covalent bonds. The monofunctional (M) unit represents $R_3SiO_{1/2}$; the difunctional (D) unit represents $R_2SiO_{2/2}$; the trifunctional (T) unit represents $RSiO_{3/2}$ and results in the formation of branched linear siloxanes; and the tetrafunctional (Q) unit represents $SiO_{4/2}$ and results in the formation of crosslinked and resinous compositions. The reactive group-functional siloxane may be $R^1 SiO_{3/2}$ units (i.e., T units) and/or $SiO_{4/2}$ units (i.e., Q units) in covalent combination with $R^1R^4{}_2SiO_{1/2}$ units (i.e., M units) and/or $R^4{}_2SiO_{2/2}$ units (i.e., D units). Each "R" group, e.g., R, $R^1$ and $R^4$ independently is hydrocarbyl, heterohydrocarbyl, or organoheteryl, which are collectively referred to herein as organogroups. Each hydrocarbyl, heterohydrocarbyl, and organoheteryl independently may have from 1 to 20, alternatively from 1 to 10, alternatively from 1 to 8, alternatively from 1 to 6 carbon atoms. Each heterohydrocarbyl and organoheteryl independently comprises carbon, hydrogen and at least one heteroatom that independently may be halo, N, O, S, or P; alternatively S; alternatively P; alternatively halo, N, or O; alternatively halo; alternatively halo; alternatively O; alternatively N. Each heterohydrocarbyl and organoheteryl independently may have up to 4, alternatively from 1 to 3, alternatively 1 or 2, alternatively 3, alternatively 2, alternatively 1 heteroatom(s). Each heterohydrocarbyl independently may be halohydrocarbyl (e.g., fluoromethyl, trifluoromethyl, trifluorovinyl, or chlorovinyl), alternatively am inohydrocarbyl (e.g., $H_2$N-hydrocarbyl) or alkylaminohydrocarbyl, alternatively dialkylaminohydrocarbyl (e.g., 3-dimethylaminopropyl), alternatively hydroxyhydrocarbyl, alternatively alkoxyhydrocarbyl (e.g., methoxyphenyl). Each organoheteryl independently may be hydrocarbyl-N(H)—, (hydrocarbyl)$_2$N—, hydrocarbyl-P(H)—, (hydrocarbyl)$_2$P-, hydrocarbyl-O—, hydrocarbyl-S—, hydrocarbyl-S(O)—, or hydrocarbyl-S(O)$_2$—. Each hydrocarbyl independently may be ($C_1$-$C_8$) hydrocarbyl, alternatively ($C_1$-$C_6$)hydrocarbyl, alternatively ($C_1$-$C_3$)hydrocarbyl, alternatively ($C_1$-$C_2$)hydrocarbyl. Each ($C_1$-$C_8$)hydrocarbyl independently may be ($C_7$-$C_8$)hydrocarbyl, alternatively ($C_1$-$C_6$)hydrocarbyl. Each ($C_7$-$C_8$)hydrocarbyl may be a heptyl, alternatively an octyl, alternatively benzyl, alternatively tolyl, alternatively xylyl. Each ($C_1$-$C_6$)hydrocarbyl independently may be ($C_1$-$C_6$)alkyl, ($C_2$-$C_6$)alkenyl, ($C_2$-$C_6$)alkynyl, ($C_3$-$C_6$)cycloalkyl, or phenyl. Each ($C_1$-$C_6$)alkyl independently may be methyl, ethyl, propyl, butyl, or pentyl; alternatively methyl or ethyl; alternatively methyl; alternatively ethyl. Each halo independently may be bromo, fluoro or chloro; alternatively bromo; alternatively fluoro; alternatively chloro. Each R, $R^1$ and $R^4$ independently may be hydrocarbyl; alternatively halohydrocarbyl; alternatively hydrocarbyl and at least one heterohydrocarbyl; alternatively hydrocarbyl and at least one organoheteryl. There may be an average of at least 1 "R" per molecule having an alkenyl or alkynyl group capable of undergoing hydrosilylation. For example, there may be an average of at most 4, alternatively at least 1, alternatively >1, alternatively at least 2, alternatively 3, alternatively from 1 to 4, alternatively from 1 to 3 alkenyl or alkynyl group per diorganosiloxane molecule each independently capable of undergoing hydrosilylation. Examples of suitable alkenyl are vinyl, fluorovinyl, trifluorovinyl, allyl, 4-buten-1-yl, and 1-buten-4-yl. Examples of suitable alkynyl are acetylenyl, propyn-3-yl, and 1-butyn-4-yl.

Referring again to ingredient (A), the polydiorganosiloxane may be a polydialkylsiloxane, e.g., an alkyldialkenylsiloxy-terminated polydialkylsiloxane or a dialkylalkenylsiloxy-terminated polydialkylsiloxane, e.g., a dialkylvinylsiloxy-terminated polydialkylsiloxane. Examples of the dialkylvinylsiloxy-terminated polydialkylsiloxane are dimethylvinylsiloxy-terminated polydimethylsiloxane; diethylvinylsiloxy-terminated polydim ethylsiloxane; methyldivinylsiloxy-terminated polydimethylsiloxane; dimethylvinylsiloxy-terminated polydiethylsiloxane; dimethylvinylsiloxy-terminated poly(methyl,ethyl)siloxane; poly(methyl, ($C_7$-$C_8$)hydrocarbyl)siloxane; and combinations thereof. Alternatively, the polydiorganosiloxane may be a hydroxy-terminated polydiorganosiloxane. The hydroxy-terminated polydiorganosiloxane may be a hydroxy-terminated polydialkylsiloxane having pendent alkenyl, alkynl, or alkenyl and alkenyl groups. Examples of the hydroxy-terminated polydialkylsiloxane are hydroxy-terminated polydimethylsiloxane having pendent vinyl groups; hydroxy-terminated polydiethylsiloxane having pendent vinyl groups; hydroxy-terminated poly(methyl,ethyl)siloxane having pendent vinyl groups; hydroxy-terminated poly(methyl, ($C_7$-$C_8$)hydrocarbyl)siloxane having pendent vinyl groups; and combinations thereof. Terminated means mono (alpha), alternatively bis (both alpha and omega) termination. Alternatively, any one of the foregoing polydialkylsiloxanes may further comprise one or more (e.g., from 1 to 3) internal (alkyl,alkynyl) units, alternatively internal (alkyl,alkenyl) units (e.g., methyl,vinyl or ethyl, vinyl units) or one or more (e.g., from 1 to 3) alkenyl-containing pendent groups, e.g., a dimethylvinylsiloxy-pendent group-containing polydimethylsiloxane. Alternatively, the polydiorganosiloxane may be an alkenyldialkylsilyl end-blocked polydialkylsiloxane; alternatively a vinyldimethylsilyl end-blocked polydimethylsiloxane. Ingredient (A) may be a polydiorganosiloxane comprising methyl and vinyl R groups. Ingredient (A) may be a poly(methyl,vinyl)siloxane (homopolymer); alternatively a hydroxy-terminated poly(methyl,vinyl)siloxane (homopolymer); alternatively a poly(methyl,vinyl)(dimethyl)siloxane copolymer; alternatively a hydroxy-terminated poly(methyl,vinyl)(dimethyl)siloxane copolymer; alternatively a mixture of any of at least two thereof. A poly(methyl,vinyl)(dimethyl)siloxane copolymer means a molecule having $R^1,R^4SiO_{2/2}$ units wherein $R^1$ is methyl and $R^4$ is vinyl and $R^1,R^1SiO_{2/2}$ units wherein each $R^1$ is methyl.

Referring again to ingredient (A), the diorganocyclosiloxane monomer may be a ($R^1,R^4$)cyclosiloxane, wherein $R^1$ and $R^4$ independently are as defined previously. The ($R^1,R^4$)cyclosiloxane may be a (($C_7$-$C_8$)hydrocarbyl,alkenyl)cyclosiloxane, (($C_7$-$C_8$)hydrocarbyl,alkynyl)cyclosiloxane, (alkyl,alkynyl)cyclosiloxane, or a (alkyl,alkenyl) cyclosiloxane, wherein ($C_7$-$C_8$)hydrocarbyl and alkyl independently are as defined previously. The (alkyl,alkenyl) cyclosiloxane may be, e.g., a (alkyl,vinyl)cyclosiloxane, e.g., a (methyl,vinyl)cyclosiloxane or (ethyl,vinyl)cyclosiloxane.

Referring again to ingredient (A), the diorganosiloxane compound may further comprise, alternatively may substantially lack volatile diorganosiloxanes. Reiterated, the diorganosiloxane compound may be used as prepared, with volatile diorganosiloxane components retained; alternatively the as prepared diorganosiloxane compound may be devolatilized to remove a volatile fraction before use in the curable organosiloxane composition.

Referring again to ingredient (A), the diorganosiloxane compound may have a number-average molecular weight ($M_n$) of from 500 to 50,000 g/mol, alternatively from 500 to 10,000 g/mol, alternatively 1,000 to 3,000, g/mol, where the $M_n$ is determined by gel permeation chromatography employing a low angle laser light scattering detector, or a refractive index detector and silicone resin (MQ) standards. The diorganosiloxane compound may have a dynamic viscosity of from 0.01 to 100,000 Pascal-seconds (Pa·s), alternatively from 0.1 to 99,000 Pa·s, alternatively from 1 to 95,000 Pa·s, alternatively from 10 to 90,000 Pa·s, alternatively from 100 to 89,000 Pa·s, alternatively from 1,000 to 85,000 Pa·s, alternatively from 10,000 to 80,000 Pa·s, alternatively from 40,000 to 75,000 Pa·s., alternatively from 10,000 to <40,000 Pa·s, alternatively from >75,000 to 100,000 Pa·s. The dynamic viscosity is measured at 25° C. according to the dynamic viscosity method described later. The diorganosiloxane compound may have less than 10 wt %, alternatively less than 5 wt %, alternatively less than 2 wt %, of silicon-bonded hydroxyl groups, as determined by $^{29}$Si-NMR. Alternatively, the diorganosiloxane compound may have less than 10 mole percent (mol %), alternatively less than 5 mol %, alternatively less than 2 mol %, of silicon-bonded hydroxyl groups, as determined by $^{29}$Si-NMR.

The ingredient (A) (e.g., the diorganosiloxane compound) may be from 1 to 39 wt %, alternatively from 3 to 30 wt %, alternatively from 4 to 20 wt % of the curable silicone composition. Alternatively, the ingredient (A) may be from 50 to 90 wt %, alternatively from 60 to 80 wt %, alternatively from 70 to 80 wt % of the hydrosilylation-curable organosiloxane.

Ingredient (B), the organohydrogensilicon compound, has at least one silicon-bonded hydrogen atom per molecule. The organohydrogensilicon compound may be a single organohydrogensilicon compound, or a plurality of different organohydrogensilicon compounds. The organohydrogensilicon compound may have organo groups and an average of at least two, alternatively at least three silicon-bonded hydrogen atoms per molecule. Each organo group independently may be the same as R, $R^1$, or $R^4$ groups as defined before. The organohydrogensilicon compound may be an organohydrogensilane, an organohydrogensiloxane, or a combination thereof. The structure of the organohydrogensilicon compound may be linear, branched, cyclic (e.g., Cyclosilanes and cyclosiloxanes), or resinous. Cyclosilanes and cyclosiloxanes may have from 3 to 12, alternatively from 3 to 10, alternatively 3 or 4 silicon atoms. In acyclic polysilanes and polysiloxanes, the silicon-bonded hydrogen atoms may be located at terminal, pendant, or at both terminal and pendant positions.

Referring to an embodiment of ingredient (B), the organohydrogensilane may be a monosilane, disilane, trisilane, or polysilane (tetra- or higher silane). Examples of suitable organohydrogensilanes are diphenylsilane, 2-chloroethylsilane, bis[(p-dimethylsilyl)phenyl]ether, 1,4-dimethyldisilylethane, 1,3,5-tris(dimethylsilyl)benzene, 1,3,5-trimethyl-1,3,5-trisilane, poly(methylsilylene)phenylene, and poly(methylsilylene)m ethylene.

Referring to an embodiment of ingredient (B), the organohydrogensiloxane may be a disiloxane, trisiloxane, or polysiloxane (tetra- or higher siloxane). The organohydrogensiloxane may be further defined as an organohydrogenpolysiloxane resin, so long as the resin includes at least one silicon-bonded hydrogen atom per molecule. The organohydrogenpolysiloxane resin may be a copolymer including T units, and/or Q units, in combination with M units, and/or D units, wherein T, Q, M and D are as described above. For example, the organohydrogenpolysiloxane resin can be a DT resin, an MT resin, an MDT resin, a DTQ resin, an MTQ resin, an MDTQ resin, a DQ resin, an MQ resin, a DTQ resin, an MTQ resin, or an MDQ resin. The M, D, T and Q units may be the same as those described previously. Examples of suitable organohydrogensiloxanes are 1,1,3,3-tetramethyldisiloxane, 1,1,3,3-tetraphenyldisiloxane, phenyltris(dimethylsiloxy)silane, 1,3,5-trimethylcyclotrisiloxane, a trim ethylsiloxy-term inated poly(methylhydrogensiloxane), a trimethylsiloxy-term inated poly(dimethylsiloxane/methylhydrogensiloxane), a dimethylhydrogensiloxy-terminated poly(methylhydrogensiloxane), and a (H,Me)Si resin. Thus, the organohydrogensilicon compound may be the trimethylsiloxy-terminated poly(dimethylsiloxane/methylhydrogensiloxane).

Referring again to ingredient (B), the organohydrogensilicon compound may have a molecular weight less than 1,000, alternatively less than 750, alternatively less than 500 g/mol. The organohydrogensilicon compound may be a dimethylhydrogensilyl terminated polydimethylsiloxane; alternatively a trialkylsilyl terminated polydialkylsiloxane-alkylhydrogensiloxane co-polymer; alternatively a trimethylsilyl terminated polydimethylsiloxane-methylhydrogensiloxane co polymer; alternatively a mixture of a dialkylhydrogensilyl terminated polydialkylsiloxane and a trialkylsilyl terminated polydialkylsiloxane-alkylhydrogensiloxane co-polymer. The dialkylhydrogensilyl terminated polydialkylsiloxane may be a dimethylhydrogensilyl terminated polydimethylsiloxane. The trialkylsilyl terminated polydialkylsiloxane-alkylhydrogensiloxane co-polymer may be a trimethylsilyl terminated polydimethylsiloxane-methylhydrogensiloxane co-polymer.

The ingredient (B) (e.g., the organohydrogensilicon compound) may be from 0.1 to 10 wt %, alternatively from 0.2 to 8 wt %, alternatively from 0.3 to 5 wt % of the curable silicone composition. Alternatively, the ingredient (B) may be from 1 to 10 wt %, alternatively from 2 to 8 wt %, alternatively from 3 to 7 wt % of the hydrosilylation-curable organosiloxane.

Referring again to ingredients (A) and (B), the hydrosilylation-curable organosiloxane may have a molar ratio of total silicon-bonded hydrogen atoms to unsaturated carbon-carbon bonds of from 0.05 to 100, alternatively from 0.1 to 100, alternatively from 0.05 to 20, alternatively from 0.5 to 15, alternatively from 1.5 to 14, alternatively from 2 to 7, alternatively from 6 to 13. When ingredients (A) and (B) are different molecules, the hydrosilylation-curable organosiloxane may have a molar ratio of silicon-bonded hydrogen atoms per molecule of the organohydrogensilicon compound to unsaturated carbon-carbon bonds per molecule of the diorganosiloxane compound of from 0.05 to 100, alternatively from 0.1 to 100, alternatively from 0.05 to 20, alternatively from 0.5 to 14, alternatively from 0.5 to 2, alternatively from 1.5 to 5, alternatively from >5 to 14. The present invention, however, is not limited to the hydrosilylation-curable organosiloxane comprising ingredients (A) and (B).

Ingredient (C), the hydrosilylation catalyst, is any compound or material useful to accelerate a hydrosilylation reaction between the diorganosiloxane compound and the organohydrogensilicon compound. The hydrosilylation catalyst may comprise a metal; a compound containing the metal; or any combination thereof. Each metal independently be platinum, rhodium, ruthenium, palladium, osmium, or iridium, or any combination of at least two thereof. Typically, the metal is platinum, based on its high activity in hydrosilylation reactions. Typically ingredient (C) is the platinum compound. Examples of suitable platinum hydrosilylation catalysts are complexes of chloroplatinic acid and certain vinyl-containing organosiloxanes in U.S. Pat. No. 3,419,593 such as the reaction product of chloroplatinic acid and 1,3-diethenyl-1,1,3,3-tetramethyldisiloxane. The hydrosilylation catalyst may be unsupported or disposed on a solid support (e.g., carbon, silica, or alumina). The hydrosilylation catalyst may be microencapsulated in a thermoplastic resin for increased stability during storage of the curable silicone composition comprising the hydrosilylation-curable organosiloxane before curing. When curing is desired, the microencapsulated catalyst (e.g., see U.S. Pat. Nos. 4,766,176 and 5,017,654) may be heated about the melting or softening point of the thermoplastic resin, thereby exposing the hydrosilylation catalyst to ingredients (A) and (B). The hydrosilylation catalyst may be a photoactivatable catalyst (e.g., platinum(II) β-diketonate complexes such as platinum(II) bis(2,4-pentanedionate)) for increased stability during storage of the curable silicone composition before curing. When curing is desired, the photoactivatable catalyst may be exposed to ultraviolet radiation having a wavelength of from 150 to 800 nanometers (nm), thereby activating the catalyst to the hydrosilylation reaction of ingredients (A) and (B).

Ingredient (C) typically is employed in a catalytically effective amount. The catalytically effective amount of the hydrosilylation catalyst is any quantity sufficient to catalyze, increase the rate of hydrosilylation of the diorganosiloxane compound and organohydrogensilicon compound. A suitable concentration of the unsupported and unencapsulated hydrosilylation catalyst in the hydrosilylation-curable organosiloxane is from 0.1 to 1000 parts per million (ppm), alternatively from 1 to 500 ppm, alternatively from 3 to 150 ppm, alternatively from 1 to 25 ppm, based on the combined weight of ingredients (A) to (C). A suitable concentration of the microencapsulated hydrosilylation catalyst in the hydrosilylation-curable organosiloxane is from 1 to 20 wt %, alternatively from 3 to 17 wt %, alternatively from 5 to 15 wt %, alternatively from 10 to 15 wt %, based on the combined weight of ingredients (A) to (C).

Optional ingredients. As described earlier, the curable silicone composition comprises the following original ingredients: the hydrocarbon vehicle, curable organosiloxane composition, and the electrically conductive filler consisting essentially of a combination of silver particles, Ag-coated core particles, and carbon nanotubes. In some embodiments the curable silicone composition and ECSA lack additional ingredients. The term "lack" means contains less than the minimum concentration of; alternatively is completely free of, does not contain (e.g., contains 0.000 wt % of), or does not include any. However, whether curable by hydrosilylation, condensation, free radical, or other chemistry, it may be desirable for the curable silicone composition and ECSA to further comprise at least one additional ingredient that is distinct from the original ingredients. The at least one additional ingredient should not affect the basic and novel characteristics of the present invention, e.g., achieving one or more of the advantages described herein for the curable silicone composition and ECSA.

When the optional ingredient is an organosiloxane, the organosiloxane comprises one or more organogroups. Each organogroup independently may be an alkyl, alkenyl, alkynyl, aryl, or organoheteryl. The organogroups are covalently bonded directly to a silicon atom of the organosiloxane. The alkyl groups of the organogroups independently may have from 1 to 6, alternatively from 1 to 3 carbon atoms; alternatively the alkyl may be methyl, alternatively ethyl, alternatively propyl. The alkenyl and alkynyl of the organogroups independently may have from 2 to 6, alternatively from 2 to 4 carbon atoms; alternatively the alkenyl may be vinyl, alternatively propen-3-yl, alternatively buten-4-yl; and alternatively the alkynyl may be acetylenyl, alternatively propyn-3-yl, alternatively butyn-4-yl. The aryl of the organogroups may be phenyl, alternatively naphthyl. The organoheteryl of the organogroups may have from 1 to 5, alternatively from 1 to 3 carbon atoms and at least one heteroatom that is O, S, or N; alternatively O or N; alternatively O; alternatively N; alternatively the organoheteryl may be alkyl-O-alkylene, alternatively dialkyl-N-alkylene; alternatively methyl-O-ethylene, alternatively methyl-O-propylene.

In some embodiments the curable silicone composition and ECSA further comprise the at least one additional ingredient. The amount of the at least one additional ingredient, when present in the curable silicone composition, or the curable silicone composition and ECSA prepared therefrom, is not so high as to prevent the curable silicone composition from satisfying at least the minimum concentrations of the original ingredients or prevent the ECSA from satisfying its limitations such as thixotropic index, volume resistivity, total silver concentration, and other functions and concentrations as described herein. When present in the curable silicone composition, the at least one additional ingredient may be at a total concentration of 0.01 to 15 wt % based on total weight of the curable silicone composition. When present, the total concentration of all the additional ingredients is from 0.1 to 12 wt %, alternatively from 1 to 10 wt %.

The curable silicone composition may be prepared with the at least one additional ingredient in any suitable manner. For example, the at least one additional ingredient may be premixed with the curable organosiloxane composition or a diorganosiloxane ingredient thereof. The resulting premixture may then be blended with the hydrocarbon vehicle, any other ingredients of the curable organosiloxane composition, and electrically conductive filler to prepare embodiments of the curable silicone composition wherein the blend further comprises the at least one additional ingredient.

Typically, the at least one additional ingredient includes an adhesion promoter, more typically an organosiloxane adhesion promoter. Alternatively or additionally, the at least one additional ingredient may be one or more of a silicone extender, organic plasticizer, or a combination of silicone extender and organic plasticizer; an inhibitor; a defoamer; a biocide; a chain lengthener; a chain endblocker; an anti-aging additive; electrically non-conductive filler particles; an acid acceptor; and a combination of any two or more selected from the immediately foregoing listing (i.e., the listing from the silicone extender to the acid acceptor). Alternatively, the at least one additional ingredient may be a combination of the adhesion promoter and any one or more selected from the immediately foregoing listing from the silicone extender to the acid acceptor. For example, the adhesion promoter may be used in combination with the silicone extender, inhibitor, electrically non-conductive filler particles, or any two or more of the silicone extender, inhibitor, and electrically non-conductive filler particles. The at least one additional ingredient may be the adhesion promoter, alternatively the silicone extender, alternatively the organic plasticizer, alternatively the combination of silicone extender and organic plasticizer, alternatively the inhibitor, alternatively the defoamer, alternatively the biocide, alternatively the chain lengthener, alternatively the chain endblocker, alternatively the anti-aging additive, alternatively the electrically non-conductive filler particles, alternatively the acid acceptor, alternatively any one of the combinations. Additionally, it is convenient to name optional ingredients by an intended use of the optional ingredient in the curable silicone composition and/or ECSA. The intended use, however is not limiting of the chemistry of the so-named optional ingredient and does not restrict how the so-named optional ingredient may react or function during curing of the curable silicone composition to give the ECSA. To illustrate, a so-called adhesion promoter may function in the curable silicone composition and/or ECSA as an adhesion promoter and optionally as a chain lengthener, crosslinker, silicone extender, or any combination of adhesion promoter and one or more of chain lengthener, crosslinker and silicone extender.

The adhesion promoters useful in the present invention may comprise a metal chelate, a silicon-based adhesion promoter, or a combination of any two or more thereof. The combination may be a combination of the metal chelate and at least one silicon-based adhesion promoter or a combination of at least two different silicon-based adhesion promoters. The different silicon-based adhesion promoters differ from each other in at least one of the following properties: structure, viscosity, average molecular weight, siloxane units, and unit sequence. Further, the silicon-based adhesion promoters differ from other silicon-based ingredients of the curable organosiloxane composition (e.g., ingredients (A) and (B) of the embodiment(s) of the hydrosilylation-curable organosiloxane) in at least one of the following properties: structure, viscosity, average molecular weight, siloxane units, and unit sequence. In some embodiments the curable silicone composition and ECSA lack the adhesion promoter; in other embodiments they further comprise the adhesion promoter.

The metal chelate adhesion promoter may be based on a metal that is lead, tin, zirconium, antimony, zinc, chromium, cobalt, nickel, aluminum, gallium, germanium, or titanium. The metal chelate may comprise the metal cation and an anionic chelating ligand such as a monocarboxylate, dicarboxylate, or alkoxide. The adhesion promoter may comprise a non-transition metal chelate such as an aluminum chelate such as aluminum acetylacetonate. Alternatively, the metal chelate may be a transition metal chelate. Suitable transition metal chelates include titanates, zirconates such as zirconium acetylacetonate, and combinations thereof. The metal chelate may be the titanium chelate. Alternatively, the adhesion promoter may comprise a combination of a metal chelate with an alkoxysilane, such as a combination of glycidoxypropyltrimethoxysilane with an aluminum chelate or a zirconium chelate. Alternatively, the metal chelate may lack silicon. Example of suitable metal chelates are mentioned in U.S. Pat. No. 4,680,364 at column 3, line 65, to column 6, line 59.

Typically, the adhesion promoter is the silicon-based adhesion promoter. Suitable silicon-based adhesion promoters include a hydrocarbyloxysilane, a combination of an alkoxysilane and a hydroxy-functional polyorganosiloxane, an aminofunctional silane, or a combination of any two or more thereof. The hydrocarbyloxysilane may be an alkoxysilane.

For example, the adhesion promoter may comprise a silane having the formula $R^{19}_r R^{20}_s Si(OR^{21})_{4-(r+s)}$ where each $R^{19}$ is independently a monovalent organic group having at least 3 carbon atoms; $R^{20}$ contains at least one Si—C-substituent wherein the substituent has an adhesion-promoting group, such as amino, epoxy, mercapto or acrylate groups; each $R^{21}$ is independently a saturated hydrocarbon group; subscript r has a value ranging from 0 to 2; subscript s is either 1 or 2; and the sum of (r+s) is not greater than 3. Saturated hydrocarbon groups for $R^{21}$ may be an alkyl group of 1 to 4 carbon atoms, alternatively alkyl of 1 or 2 carbon atoms. $R^{21}$ may be methyl, ethyl, propyl, or butyl; alternatively $R^{21}$ may be methyl. Alternatively, the adhesion promoter may comprise a partial condensate of the above silane. Alternatively, the adhesion promoter may comprise a combination of an alkoxysilane and a hydroxy-functional polyorganosiloxane.

Alternatively, the adhesion promoter may comprise an unsaturated or epoxy-functional compound. The adhesion promoter may comprise an unsaturated or epoxy-functional alkoxysilane. For example, the functional alkoxysilane can have the formula $R^{22}_t Si(OR^{23})_{(4-t)}$, where subscript t is 1, 2, or 3, alternatively subscript t is 1. Each $R^{22}$ is independently a monovalent organic group with the proviso that at least one $R^{22}$ is an unsaturated organic group or an epoxy-functional organic group. Epoxy-functional organic groups for $R^{22}$ are exemplified by 3-glycidoxypropyl and (epoxycyclohexyl) ethyl. Unsaturated organic groups for $R^{22}$ are exemplified by 3-methacryloyloxypropyl, 3-acryloyloxypropyl, and unsaturated monovalent hydrocarbon groups such as vinyl, allyl, hexenyl, undecylenyl. Each $R^{23}$ is independently a saturated hydrocarbon group of 1 to 4 carbon atoms, alternatively 1 to 2 carbon atoms. $R^{23}$ is exemplified by methyl, ethyl, propyl, and butyl.

Examples of suitable epoxy-functional alkoxysilane type adhesion promoters include 3-glycidoxypropyltrim ethoxysilane, 3-glycidoxypropyltriethoxysilane, (epoxycyclohexyl)ethyldimethoxysilane, (epoxycyclohexyl)ethyldiethoxysilane and combinations thereof. Examples of suitable unsaturated alkoxysilanes include vinyltrimethoxysilane, allyltrimethoxysilane, allyltriethoxysilane, hexenyltrimethoxysilane, undecylenyltrim ethoxysilane, 3-methacryloyloxypropyl trimethoxysilane, 3-methacryloyloxypropyl triethoxysilane, 3-acryloyloxypropyl trimethoxysilane, 3-acryloyloxypropyl triethoxysilane, and combinations thereof.

Alternatively, the adhesion promoter may comprise an epoxy-functional organosiloxane such as a reaction product of a hydroxy-terminated polyorganosiloxane with an epoxy-functional alkoxysilane, as described above, or a physical blend of the hydroxy-terminated polyorganosiloxane with the epoxy-functional alkoxysilane. The epoxy-functional organosiloxane comprises one or more, alternatively two or more epoxy groups and at least one type of organogroup such as the alkyl, alkenyl, alkynyl, aryl, or organoheteryl. The epoxy group(s) independently may be covalently bonded directly to a silicon atom of the organosiloxanyl portion of the epoxy-functional organosiloxane or to any carbon atom of the organogroup. The epoxy group(s) may be located at internal, terminal, or both positions of the organosiloxanyl portion. The epoxy-functional organosiloxane may be an epoxy-functional diorganosiloxane, an epoxy-functional organo,hydrogensiloxane; or an epoxy-functional diorgano/(organo,hydrogen)siloxane. The "diorgano/(organo,hydrogen)" indicates the siloxane has both diorganoSi D units ("D") and organo-SiH D units ($D^H$) in the organosiloxanyl portion. The organogroups in any one of such diorganoSi D units may be the same as or different from each other. For example, the epoxy-functional diorganosiloxane may be a bis(alpha,omega-glycidoxyalkyl)-dialkyl/

(alkyl,alkenyl)siloxane. The "dialkyl/(alkyl,alkenyl)" indicates siloxane has both dialkylSi D units and alkyl,alkenylSi D units. The "bis(alpha,omega-glycidoxyalkyl)" indicates a dialkyl/alkyl,alkenylsiloxanyl moiety has two terminal glycidoxyalkyl groups, and 0 or optionally 1 or more internal glycidoxyalkyl groups. Alternatively, the adhesion promoter may comprise a combination of an epoxy-functional alkoxysilane and an epoxy-functional siloxane. For example, the adhesion promoter is exemplified by a mixture of 3-glycidoxypropyltrim ethoxysilane and a reaction product of hydroxy-terminated methylvinylsiloxane (i.e., hydroxy-terminated poly(methyl,vinyl)siloxane) with 3-glycidoxypropyltrimethoxysilane, or a mixture of 3-glycidoxypropyltrimethoxysilane and a hydroxy-terminated methylvinylsiloxane, or a mixture of 3-glycidoxypropyltrimethoxysilane and a hydroxy-terminated methylvinyl/dimethylsiloxane copolymer.

Alternatively, the adhesion promoter may comprise an epoxy-functional organocyclosiloxane. The epoxy-functional organocyclosiloxane comprises one or more, alternatively two or more epoxy groups and at least one type of organogroup such as the alkyl, alkenyl, alkynyl, aryl, or organoheteryl. For example, the epoxy-functional organocyclosiloxane may be an epoxy-functional D3 to D6 diorganocyclosiloxane; an epoxy-functional D3 to D6 organo,hydrogencyclosiloxane; or an epoxy-functional D3 to D6 diorgano/(organo,hydrogen)cyclosiloxane. The D3 is an organocyclotrisiloxane; D4 is an organocyclotetrasiloxane; D5 is an organocyclopentasiloxane; and D6 is an organocyclohexasiloxane. The epoxy-functional organocyclosiloxane may have one or more, alternatively two or more organocyclosiloxanyl moieties, wherein any two organocyclosiloxanyl moieties may be linked to each other via an alkylene-diorganosiloxanylene-alkylene chain. For example, the epoxy-functional D3 to D6 organo,hydrogencyclosiloxane may be a bis(alpha,omega-glycidoxyalkyl-D3 to D6 organo,hydrogencyclosiloxane), wherein there are at least two glycidoxyalkyl moieties; there are at least two organo,hydrogencyclosiloxanyl moieties, which may be the same as or different from each other; and any two organo,hydrogencyclosiloxanyl moieties independently are linked to each other via an alkylene-diorganosiloxanylene-alkylene chain. Each chain may be the same as or different from each other, may be linear or branched, and may have a backbone of from 3 to 100, alternatively from 5 to 90, alternatively from 8 to 50 atoms, wherein the backbone atoms are C, Si, and O. The epoxy group(s) independently may be covalently bonded directly to a silicon atom of the organocyclosiloxanyl moiety or, when there are two or more organocyclosiloxanyl moieties, to a silicon atom of the alkylene-diorganosiloxanylene-alkylene chain; or the epoxy group(s) may be covalently bonded directly to any carbon atom of any organogroup thereof. The groups in any D unit may be the same as or different from each other.

Alternatively, the adhesion promoter may comprise an aminofunctional silane, such as an aminofunctional alkoxysilane exemplified by $H_2N(CH_2)_2Si(OCH_3)_3$, $H_2N(CH_2)_2Si(OCH_2CH_3)_3$, $H_2N(CH_2)_3Si(OCH_3)_3$, $H_2N(CH_2)_3Si(OCH_2CH_3)_3$, $CH_3NH(CH_2)_3Si(OCH_3)_3$, $CH_3NE(CH_2)_3Si(OCH_2CH_3)_3$, $CH_3NH(CH_2)_5Si(OCH_3)_3$, $CH_3NH(CH_2)_5Si(OCH_2CH_3)_3$, $H_2N(CH_2)_2NH(CH_2)_3Si(OCH_3)_3$, $H_2N(CH_2)_2NH(CH_2)_3Si(OCH_2CH_3)_3$, $CH_3N H(CH_2)_2 NH(CH_2)_3Si(OC H_3)_3$, $CH_3NH(CH_2)_2NH(CH_2)_3Si(OCH_2CH_3)_3$, $C_4H_9NH(CH_2)_2NH(CH_2)_3Si(OCH_3)_3$, $C_4H_9NH(CH_2)_2NH(CH_2)_3Si(OCH_2CH_3)_3$, $H_2N(CH_2)_2SiCH_3(OCH_3)_2$, $H_2N(CH_2)_2SiCH_3(OCH_2CH_3)_2$, $H_2N(CH_2)_3SiCH_3(OCH_3)_2$, $H_2N(CH_2)_3SiCH_3(OCH_2CH_3)_2$, $CH_3NE(CH_2)_3SiCH_3(OCH_3)_2$, $CH_3NH(CH_2)_3SiCH_3(OCH_2CH_3)_2$, $CH_3NH(CH_2)_5SiCH_3(OCH_3)_2$, $CH_3NH(CH_2)_5SiCH_3(OCH_2CH_3)_2$, $H_2N(CH_2)_2NH(CH_2)_3SiCH_3(OCH_3)_2$, $H_2N(CH_2)_2NH(CFl_2)_3SiCH_3(OCH_2CH_3)_2$, $C H_3N H(CH_2)_2N F(CH_2)_3SiC H_3(OCH_3)_2$, $CH_3NH(CH_2)_2NH(CH_2)_3SiCH_3(OCH_2CH_3)_2$, $C_4H_9NH(CH_2)_2NH(CH_2)_3SiCH_3(OCH_3)_2$, $C_4H_9NH(CH_2)_2NH(CH_2)_3SiCH_3(OCH_2CH_3)_2$, and a combination thereof.

The concentration of adhesion promoter, when present, may be from 0.1 to 10 wt %, alternatively from 0.5 to 7 wt %, alternatively from 0.7 to 5 wt %, all based on weight of the curable silicone composition. Alternatively, the concentration of adhesion promoter, when present, may be from 1 to 10 wt %, alternatively from 2 to 9 wt %, alternatively from 3 to 8 wt %, all based on weight of the curable organosiloxane composition.

The silicone extender may be an unsubstituted hydrocarbyl-containing MD organosiloxane such as a bis(trihydrocarbyl-terminated) dihydrocarbylorganosiloxane, wherein each hydrocarbyl independently is unsubstituted ($C_1$-$C_{10}$) alkyl (e.g., methyl), ($C_2$-$C_{10}$)alkenyl, ($C_2$-$C_{10}$)alkynyl, benzyl, phenethyl, phenyl, tolyl, or naphthyl. Examples of the silicone extender are polydimethylsiloxanes, including DOW CORNING® 200 Fluids, Dow Corning Corporation, Midland, Mich., USA. These fluids may have kinematic viscosity ranging from 50 to 100,000 centiStokes (cSt; 50 to 100,000 square millimeters per second (($mm^2$/s))), alternatively 50 to 50,000 cSt (50 to 50,000 $mm^2$/s), and alternatively 12,500 to 60,000 cSt (12,500 to 60,000 $mm^2$/s). The kinematic viscosity is measured according to the method described later. In some embodiments the curable silicone composition and ECSA lack the silicone extender; in other embodiments they further comprise the silicone extender. The concentration of the silicone extender, when present, may be from 0.1 to 10 wt %, alternatively from 0.5 to 5 wt %, alternatively from 1 to 5 wt %, all based on weight of the curable silicone composition.

The organic plasticizer may be used in place of, or in addition to, the silicone extender. The organic plasticizer may be used in addition to the hydrocarbon vehicle in the curable silicone composition. The organic plasticizer may be a carboxylic acid ester such as a bis(($C_1$-$C_{10}$)alkyl) phthalate, bis(($C_1$-$C_{10}$)alkyl) terephthalate, bis(($C_1$-$C_{10}$)alkyl) cyclohexanedicarboxylate, or bis(($C_1$-$C_{10}$)alkyl) adipate ester, or a combination thereof. In some embodiments the curable silicone composition and ECSA lack the organic plasticizer; in other embodiments they further comprise the organic plasticizer. The concentration of the organic plasticizer, when present, may be from 0.1 to 10 wt %, alternatively from 0.5 to 5 wt %, alternatively from 1 to 5 wt %, all based on weight of the curable silicone composition.

The combination of the silicone extender and organic plasticizer. The combination of the silicone extender and organic plasticizer may comprise a polydimethylsiloxane fluid and one of the immediately foregoing carboxylic acid esters. In some embodiments the curable silicone composition and ECSA lack the combination of the silicone extender and organic plasticizer; in other embodiments they further comprise the combination. The concentration of the combination, when present, may be from 0.1 to 10 wt %, alternatively from 0.5 to 5 wt %, alternatively from 1 to 5 wt %, all based on weight of the curable silicone composition.

The inhibitor may be used to delay onset of, inhibit, slow the reaction rate of, or prevent start of the hydrosilylation reaction of the hydrosilylation-curable organosiloxane as compared to that of the same composition but with the inhibitor omitted therefrom. Examples of suitable hydrosilylation reaction inhibitors are acetylenic alcohols, silylated acetylenic compounds, cycloalkenylsiloxanes, ene-yne compounds, phosphines, mercaptans, hydrazines, amines, fumarate diesters, and maleate diesters, Examples of the acetylenic alcohols are 1-propyn-3-ol; 1-butyn-3-ol; 2-methyl-3-butyn-2-ol; 3-methyl-1-butyn-3-ol; 3-methyl-1-pentyn-3-ol; 4-ethyl-1-octyn-3-ol; 1-ethynyl-1-cyclohexanol; 3,5-dimethyl-1-hexyn-3-ol; 4-ethyl-1-octyn-3-ol; 1-ethynyl-1-cyclohexanol; 3-phenyl-1-butyn-3-ol; and 2-phenyl-3-butyn-2-ol. E.g., the inhibitor may be 1-ethynyl-1-cyclohexanol. Examples of cycloalkenylsiloxanes are methylvinylcyclosiloxanes, e.g., 1,3,5,7-tetramethyl-1,3,5,7-tetravinylcyclotetrasiloxane and 1,3,5,7-tetramethyl-1,3,5,7-tetrahexenylcyclotetrasiloxane. Examples of ene-yne compounds are 3-methyl-3-penten-1-yne and 3,5-dimethyl-3-hexen-1-yne. An example of phosphines is triphenylphosphine. Examples of fumarate diesters are dialkyl fumarates, dialkenyl fumarates (e.g., diallyl fumarates), and dialkoxyalkyl fumarates. Examples of maleate diesters are dialklyl maleates and diallyl maleates. Examples of silylated acetylenic compounds are (3-methyl-1-butyn-3-oxy)trimethylsilane, ((1,1-dimethyl-2-propynyl)oxy)trimethylsilane, bis(3-methyl-1-butyn-3-oxy)dimethylsilane, bis(3-methyl-1-butyn-3-oxy)silanemethylvinylsilane, bis((1,1-dimethyl-2-propynyhoxy)dimethylsilane, methyl(tris(1,1-dimethyl-2-propynyloxy))silane, methyl(tris(3-methyl-1-butyn-3-oxy)) silane, (3-methyl-1-butyn-3-oxy)dimethylphenylsilane, (3-methyl-1-butyn-3-oxy)dimethylhexenylsilane, (3-methyl-1-butyn-3-oxy)triethylsilane, bis(3-methyl-1-butyn-3-oxy)methyltrifluoropropylsilane, (3,5-dimethyl-1-hexyn-3-oxy)trimethylsilane, (3-phenyl-1-butyn-3-oxy)diphenylmethylsilane, (3-phenyl-1-butyn-3-oxy) dimethylphenylsilane, (3-phenyl-1-butyn-3-oxy) dimethylvinylsilane, (3-phenyl-1-butyn-3-oxy) dimethylhexenylsilane, (cyclohexyl-1-ethyn-1-oxy) dimethylhexenylsilane, (cyclohexyl-1-ethyn-1-oxy) dimethylvinylsilane, (cyclohexyl-1-ethyn-1-oxy) diphenylmethylsilane, and (cyclohexyl-1-ethyn-1-oxy) trimethylsilane. The inhibitor may be methyl(tris(1,1-dimethyl-2-propynyloxy))silane or ((1,1-dimethyl-2-propynyl)oxy)trimethylsilane. The inhibitor may be a combination of any two or more of the foregoing examples, either taken from within a single structural class or from at least two different structural classes. In some embodiments the curable silicone composition and ECSA lack the inhibitor; in other embodiments they further comprise the inhibitor. The concentration of the inhibitor, when present, may be from 0.1 to 5 wt %, alternatively from 0.5 to 2 wt %, all based on weight of the curable silicone composition.

The defoamer may be used to inhibit or prevent foaming during formation of the curable silicone composition or the curable organosiloxane composition. Examples of suitable defoamers include silicone-free defoamers such as those commercially available from BYK USA, Wallingford, Conn., USA. An example is BYK-052, which is a blend containing Stoddard Solvent (mineral spirits), 30 to 60 wt %, naphtha, petroleum hydrosulfurized heavy 30 to 60 wt %, hydroxy acetic acid butyl ester 5 to 10 wt %, and 2-butoxyethanol 1 to 5 wt %. In some embodiments the curable silicone composition and ECSA lack the defoamer; in other embodiments they further comprise the defoamer. The concentration of the defoamer, when present, may be from 0.1 to 10 wt %, alternatively from 0.5 to 5 wt %, all based on weight of the curable silicone composition.

The biocide may be an antimicrobial compound, antibacterial compound, antiviral compound, fungicide, herbicide, or pesticide. The biocide may be used to inhibit contamination or degradation of the curable silicone composition or the curable organosiloxane composition during manufacturing, storage, transportation, or application thereof; and/or inhibit contamination or degradation of the ECSA during curing and or use in the electrical component. In some embodiments the curable silicone composition and ECSA lack the biocide; in other embodiments they further comprise the biocide. The concentration of the biocide, when present, may be from 0.1 to 5 wt %, alternatively from 0.5 to 1 wt %, all based on weight of the curable silicone composition.

The chain lengthener may be used to extend lengths of chains of ingredients (A), (B), or (A) and (B) before any coupling or crosslinking occurs during curing of the curable silicone composition. Examples of suitable chain lengtheners are difunctional silanes (e.g., 1,1,2,2-tetramethyldisilane) and difunctional siloxanes (e.g., a dimethylhydrogen-terminated polydimethylsiloxane having a degree of polymerization (DP) of from 3 to 50, e.g., from 3 to 10). In some embodiments the curable silicone composition and ECSA lack the chain lengthener; in other embodiments they further comprise the chain lengthener. The concentration of the chain lengthener, when present, may be from 0.1 to 10 wt %, alternatively from 0.5 to 5 wt %, all based on weight of the curable silicone composition.

The chain endblocker may be used to terminate a chain and prevent further extending or crosslinking during curing of the curable silicone composition. The chain endblocker may be an unsubstituted hydrocarbyl-containing siloxane M unit, wherein the hydrocarbyl independently is as described for the hydrocarbyl of the silicone extender. An example of a suitable chain endblocker is an organosiloxane having one or more trimethylsiloxy groups. In some embodiments the curable silicone composition and ECSA lack the chain endblocker; in other embodiments they further comprise the chain endblocker. The concentration of the chain endblocker, when present, may be from 0.1 to 10 wt %, alternatively from 0.5 to 5 wt %, all based on weight of the curable silicone composition.

The anti-aging additive may be used to delay onset of, inhibit, decrease rate of, or prevent degradation of the curable silicone composition and/or ECSA when exposed to degradation-promoting condition(s). Examples of degradation promoting conditions are exposure to oxidant, ultraviolet light, heat, moisture, or a combination of any two or more thereof. Examples of suitable anti-aging additives are antioxidants, UV absorbers, UV stabilizers, heat stabilizers, desiccants, and combinations thereof. Suitable antioxidants include sterically hindered phenols (e.g., vitamin E). Suitable UV absorbers/stabilizers include phenol. Suitable heat stabilizers include iron oxides and carbon blacks. Suitable moisture stabilizers include anhydrous forms of silica, magnesium oxide and calcium oxide. In some embodiments the curable silicone composition and ECSA lack the anti-aging additive; in other embodiments they further comprise the anti-aging additive. The concentration of the anti-aging additive, when present, may be from 0.01 to 5 wt %, alternatively from 0.1 to 2 wt %, all based on weight of the curable silicone composition.

The electrically non-conductive filler particles may be particles of silica glass such as soda-lime-silica glass or borosilicate glass, diamond polymorph of carbon, silica, organic polymer, or a ceramic. The electrically non-conductive filler particles are distinct from the Ag-coated core particles in that the former lack a coating of silver thereon, whereas the latter have a coating of silver thereon. The electrically non-conductive filler particles are distinct from the aforementioned electrically conductive filler. The silica glass particles may be solid or hollow. The electrically non-conductive filler particles may be cuboidals, flakes, granules, irregulars, needles, powders, spheres, or a mixture of any two or more of cuboidals, flakes, granules, irregulars, needles, powders, and spheres. The electrically non-conductive filler particles may have an average particle size of from 5 to 100 µm. The electrically non-conductive filler particles may have sufficient size to improve (i.e., increase) packing of the silver filler in the ECSA such that the ECSA has lower volume resistivity than that of a comparative ECSA having the same concentration of electrically non-conductive filler particles having smaller size. Such sufficient size may be an average particle diameter of the electrically non-conductive filler particles greater than average particle diameter of the silver filler. Spherical silica glass filler particles may beneficially enhance (i.e., decrease) volume resistivity of the resulting ECSA compared to that of an ECSA prepared from an identical curable silicone composition except lacking the spherical silica glass filler particles. Alternatively or additionally, the spherical silica glass filler particles may beneficially help maintain thickness uniformity of a bondline of the curable silicone composition, ECSA, or both, wherein the bondline has been disposed on a substrate such as a substrate for an electrical component, and the resulting component experiences above ambient temperature, pressure, or both (e.g., as during a laminating step). Alternatively or additionally, the spherical silica glass filler particles may beneficially penetrate or mechanically abrade away a metal oxide layer (e.g., copper oxide layer) that may have been formed on an exterior surface of a substrate prone to oxidation or on a surface of the silver particles, Ag-coated core particles, or any combination thereof. An example of the substrate prone to oxidation is a copper foil or wire, a surface layer of which copper may spontaneously oxidize in air to form a copper oxide layer. The concentration of the electrically non-conductive filler particles, when present, may be from 0.1 to 10 wt %, alternatively from 0.5 to 8 wt %, all based on weight of the curable silicone composition.

The acid acceptor may be used to delay onset of, inhibit, or prevent acid-promoted reactions, side-reactions or degradations. Suitable acid acceptors include magnesium oxide and calcium oxide. In some embodiments the curable silicone composition and ECSA lack the acid acceptor; in other embodiments they further comprise the acid acceptor. The concentration of the acid acceptor, when present, may be from 0.1 to 5 wt %, alternatively from 0.5 to 2 wt %, all based on weight of the curable silicone composition.

In some embodiments the curable silicone composition is a curable silicone composition comprising a blend of the following ingredients: An isoalkanes mixture comprising at least three of ($C_{12}$-$C_{16}$)isoalkanes and has an initial boiling point of greater than 210 degrees Celsius and an end boiling point of less than 270 degrees Celsius and the hydrocarbon vehicle is at a concentration of from 6 to 11 weight percent based on weight of the curable silicone composition; A hydrosilylation-curable polydimethylsiloxane composition comprising at least one vinyl-functional polydimethylsiloxane compound having on average per molecule at least 1 vinyl moieties, at least one trimethylsiloxy-terminated dimethyl methylhydrogensilicon compound having on average per molecule at least 1.1 Si—H moieties, a microencapsulated platinum hydrosilylation catalyst, a bis(alpha,omega-glycidoxyalkyl-D3 to D6 alkyl,hydrogencyclosiloxane), and bis(alpha,omega-glycidoxyalkyl)-dialkyl/(alkyl,alkenyl)siloxane adhesion promoter; and wherein the vinyl-functional polydimethylsiloxane compound is from 70 to 78 weight percent of the hydrosilylation-curable polydimethylsiloxane composition; the trimethylsiloxy-terminated dimethyl methylhydrogensilicon compound is from 1 to 8 weight percent of the hydrosilylation-curable polydimethylsiloxane composition; the microencapsulated hydrosilylation catalyst is from 10 to 15 weight percent of the hydrosilylation-curable polydimethylsiloxane composition, the bis(alpha,omega-glycidoxyalkyl-D3 to D6 alkyl,hydrogencyclosiloxane) is from 0 to 7 weight percent of the hydrosilylation-curable polydimethylsiloxane composition, and the bis(alpha, omega-glycidoxyalkyl)-dialkyl/(alkyl,alkenyl)siloxane adhesion promoter is from 0 to 10 weight percent of the hydrosilylation-curable polydimethylsiloxane composition; and wherein together the trimethylsiloxy-terminated dimethyl methylhydrogensilicon compound, microencapsulated hydrosilylation catalyst, bis(alpha,omega-glycidoxyalkyl-D3 to D6 alkyl,hydrogencyclosiloxane), and the bis(alpha, omega-glycidoxyalkyl)-dialkyl/(alkyl,alkenyl)siloxane adhesion promoter are from 20 to 30 wt % of the hydrosilylation-curable polydimethylsiloxane composition; and Electrically conductive filler consisting essentially of a combination of silver particles, silver-coated nickel particles, and multi-walled carbon nanotubes; wherein the silver particles are silver flakes, and wherein the concentration of silver flakes is from 40 to 51 weight percent, the concentration of silver-coated nickel particles is from 17 to 32 weight percent, and the total concentration of silver is from 54.0 to 59.0 weight percent, all based on weight of the curable silicone composition; wherein the concentration of silver in the silver-coated nickel particles is from 28 to 42 weight percent based on weight of the silver-coated nickel particles; and wherein the multi-walled carbon nanotubes are at a concentration of from 0.3 to 2.2, alternatively from 0.7 to 2.2 weight percent based on weight of the curable silicone composition; Wherein the curable silicone composition is characterizable by a Thixotropic Index($\eta_1/\eta_{10}$) of from 3 to 7 measured according to TI Test Method described later; and Wherein the curable silicone composition is characterizable by a volume resistivity of less than 0.00070 Ohm-centimeter measured according to Volume Resistivity Test Method. Alternatively, the vinyl-functional polydimethylsiloxane compound may be from 70 to 75 weight percent of the hydrosilylation-curable polydimethylsiloxane composition; the trim ethylsiloxy-terminated dimethyl methylhydrogensilicon compound may be from 1 to 5 weight percent of the hydrosilylation-curable polydimethylsiloxane composition; the microencapsulated hydrosilylation catalyst may be from 10 to 15 weight percent of the hydrosilylation-curable polydimethylsiloxane composition; the bis(alpha,omega-glycidoxyalkyl-D3 to D6 alkyl,hydrogencyclosiloxane) may be from 0 to 7 weight percent (e.g., 0 weight percent), alternatively from 0.1 to 7 weight percent of the hydrosilylation-curable polydimethylsiloxane composition, and the bis(alpha,omega-glycidoxyalkyl)-dialkyl/(alkyl,alkenyl)siloxane adhesion promoter may be from 0.1 to 10 weight percent, alternatively from 1 to 10 weight percent, of the hydrosilylation-curable polydimethylsiloxane composition. Prior to its use to prepare the curable silicone composition, the hydrosilylation-curable polydimethylsiloxane composition may lack the hydrocarbon vehicle, silver particles, and silver-coated core particles. As for concentrations of the ingredients in terms of weight percent of the curable silicone composition prepared with the hydrosilylation-curable polydimethylsiloxane composition, the vinyl-functional polydimethylsiloxane compound may be from 16 to 18 weight percent (e.g., 17 wt %) of the curable silicone composition, the trimethylsiloxy-terminated dimethyl methylhydrogensilicon compound may be from 0.1 to 2 weight percent (e.g., 1 wt %) of the curable silicone composition, the microencapsulated hydrosilylation catalyst may be from 2 to 5 weight percent (e.g., 3 wt %) of the curable silicone composition, the bis(alpha,omega-glycidoxyalkyl)-dialkyl/(alkyl,alkenyl)siloxane adhesion promoter may be from 1 to 4 weight percent (e.g., 2 wt %) of the curable silicone composition, and the multi-walled carbon nanotubes may be at a concentration of from 0.7 to 2.2 weight percent (e.g., 1 wt %) of the curable silicone composition. In such an embodiment of the curable silicone composition the concentration of the hydrocarbon vehicle may be from 6 to 11 weight percent of the curable silicone composition, the silver particles may be silver flakes and may be at a concentration of from 49 to 51 weight percent of the curable silicone composition, and the silver-coated nickel particles may be at a concentration of 17 to 20 weight percent, alternatively from >20 to 32 weight percent of the curable silicone composition. In such an embodiment, the total concentration of silver may be from 54.0 to 59.4 wt % of the curable silicone composition. When the curable silicone composition also contains the bis(alpha,omega-glycidoxyalkyl-D3 to D6 alkyl,hydrogencyclosiloxane), the concentration of the bis(alpha,omega-glycidoxyalkyl-D3 to D6 alkyl,hydrogencyclosiloxane) may be from 0.5 to 1.5 weight percent (e.g., 1 wt %) of the curable silicone composition.

The concentration of SiH-containing ingredients may be adjusted in the curable silicone composition such that the total SiH concentration in the curable silicone composition may be reached with different proportions of the SiH-containing ingredients. For example, when the curable silicone composition also contains the bis(alpha,omega-glycidoxyalkyl-D3 to D6 alkyl,hydrogencyclosiloxane), the concentration of the trimethylsiloxy-terminated dimethyl methylhydrogensilicon compound may be from 0.2 to 0.9 weight percent (e.g., 0.5 wt %) and the concentration of the bis(alpha,omega-glycidoxyalkyl-D3 to D6 alkyl,hydrogencyclosiloxane) may be from 0.5 to 1.5 weight percent (e.g., 1 wt %), both based on weight of the curable silicone composition. When the curable silicone composition lacks (i.e., 0 wt %) the bis(alpha,omega-glycidoxyalkyl-D3 to D6 alkyl,hydrogencyclosiloxane), the concentration of the trimethylsiloxy-terminated dimethyl methylhydrogensilicon compound may be from 0.2 to 1.5, alternatively from 0.9 to 1.5 weight percent based on weight of the curable silicone composition.

It is generally known in the art how to prepare curable silicone compositions comprising multiple ingredients including fillers. For example, the curable silicone composition and curable organosiloxane composition may be prepared by a method comprising combining the ingredients such as by mixing. The ingredients may be combined in any order, simultaneously, or any combination thereof unless otherwise noted herein. Typically mechanics of the combining comprises contacting and mixing ingredients with equipment suitable for the mixing. The equipment is not specifically restricted and may be, e.g., agitated batch kettles for relatively high flowability (low dynamic viscosity) compositions, a ribbon blender, solution blender, co-kneader, twin-rotor mixer, Banbury-type mixer, mill, or extruder. The method may employ continuous compounding equipment, e.g., extruders such as twin screw extruders (e.g., Baker Perkins sigma blade mixer or high shear Turello mixer), may be used for preparing compositions containing relatively high amounts of particulates. The curable silicone composition and curable organosiloxane composition may be prepared in batch, semi-batch, semi-continuous, or continuous process. General methods are known, e.g., US 2009/0291238; US 2008/0300358.

The curable silicone composition and curable organosiloxane composition may be prepared as a one part or multiple part composition. The one-part composition may be prepared by combining all ingredients by any convenient means, such as mixing, e.g., as described for the method. All mixing steps or just a final mixing step may be performed under conditions that minimize or avoid heating (e.g., maintain temperature below 30° C. during mixing). The multiple part (e.g., 2 part) composition may be prepared where at least a primary organosiloxane (e.g., the diorganosiloxane such as ingredient (A)), and optionally any other organosilicon compound (e.g., an adhesion promoter and/or chain extender/crosslinker such as the organohydrogensilicon compound of ingredient (B)), is stored in one part, and any catalyst (e.g., ingredient (C)) is stored in a separate part, and the parts are combined (e.g., by mixing) shortly before use of the composition. Alternatively, the primary organosiloxane and any catalyst may be stored in one part and any other organosilicon compound may be stored in a separate part. Typically the chain extender/crosslinker and the catalyst are stored in separate parts when the catalyst is catalytically active (not microencapsulated or not inhibited). A master batch containing the primary organosiloxane may be prepared and stored until ready for dilution to prepare the one part. An illustrative preparation is described later in the examples.

The carbon nanotubes may be mixed with at least a portion of the curable organosiloxane composition to form a master batch comprising a dispersion of the carbon nanotubes and at least the portion of the curable organosiloxane composition. The dispersing of the carbon nanotubes into the portion of the curable organosiloxane composition to prepare the master batch may be carried out by any suitable mixing means. Examples of suitable mixing means are ultrasonication, dispersion mixing, planetary mixing, and three roll milling. Alternatively or additionally, surfactants may be used to facilitate dispersion of the carbon nanotubes in a carrier liquid (e.g., water) to form an emulsion, which may be mixed with the curable organosiloxane composition to give a temporary mixture, and then the carrier liquid (e.g., water) may be removed from the temporary mixture to give the master batch. For convenience, the carrier liquid may have having a boiling point from 20° to 150° C. When a surfactant is used, the carrier liquid typically is water or an aqueous mixture, but the carrier liquid may be non-aqueous such as methanol or a polydimethylsiloxane fluid having a boiling point from 20° to 150° C. Once formed the master batch may then be mixed with the other ingredients of the curable silicone composition, including any remaining portion of the curable organosiloxane composition, to prepare the curable silicone composition.

Once prepared the curable silicone composition and curable organosiloxane composition may be used immediately or stored for any practical period, e.g., ≥1 hour, alternatively ≥1 day, alternatively ≥1 week, alternatively ≥30 days, alternatively ≥180 days before use. The curable silicone composition and curable organosiloxane composition may be best if used by 365 days, alternatively 180 days, although this maximum storage period may be increased depending upon the storage conditions such as container, atmosphere within the container, and storage temperature. The curable silicone composition and curable organosiloxane composition may be stored in a container that protects the curable silicone composition or curable organosiloxane composition from exposure to curing conditions (e.g., heat or moisture). The storage may be at a suitable temperature (e.g., −40 to −20° C., e.g., −30° C.) and, if desired, under an inert gas atmosphere (e.g., $N_2$ or Ar gas). When desired, curing of the curable silicone composition may be initiated by exposing it to the curing conditions to give the ECSA.

The curable silicone composition may be characterized by the characteristics of the ECSA prepared therefrom. For example, the curable silicone composition may be characterizable by a volume resistivity, electrically conductivity, flexibility, or any combination thereof of the ECSA.

The electrically conductive silicone adhesive (ECSA). The ECSA may comprise a binder matrix comprising any cured silicone composition such as a condensation cured organosiloxane, free radical cured organosiloxane, or hydrosilylation cured organosiloxane. Some embodiments of the present invention provide the ECSA as a composition of matter, which may be described as a product-by-process. Other embodiments provide the ECSA as a composite structure comprising the silver particles, Ag-coated core particles, and carbon nanotubes widely dispersed throughout a binder matrix (cured organosiloxane matrix) comprising a product of curing the curable silicone composition. The as-cured ECSA may facilitate transmission of electric current as is, e.g., such that an as-cured ECSA disposed between first and second electrical components of an electrical device facilitates conduction of electric current between the first and second electrical components via the as-cured ECSA without having to expose the electrically conductive filler in the as-cured ECSA. The composite structure of the ECSA may be characterizable by a cross-sectional image, longitudinal image, or two- or three-dimensional arrangement of the silver particles, Ag-coated core particles, and carbon nanotubes in the binder matrix. The carbon nanotubes may require higher magnification viewing to be seen in the cross-sectional image compared to any magnification that may be used to view the silver particles, Ag-coated core particles, and/or cured organosiloxane matrix. The ECSA may be characterized by a volume resistivity of less than 0.001 Ohm-cm, or any one of the aforementioned volume resistivity ranges described before. The ECSA may be characterizable by a volume resistivity less than 0.0010 Ohm-centimeter (Ohm-cm), alternatively <0.00099 Ohm-cm, alternatively <0.00090 Ohm-cm, alternatively <0.00080 Ohm-cm, alternatively <0.00070 Ohm-cm, alternatively <0.00065 Ohm-cm, alternatively <0.00050 Ohm-cm, alternatively <0.00020 Ohm-cm, for example from 0.00010 to 0.00090 Ohm-cm, alternatively from 0.00014 to 0.00087 Ohm-cm. The volume resistivity of the curable silicone composition is >0 Ohm-cm. Unless indicated otherwise herein, all volume resistivity values are measured according to Volume Resistivity Test Method, described later.

The ECSA may provide adhesion to a variety of different substrates such as a metal (e.g., aluminum), a ceramic, or a silica glass substrate. In some embodiments, surfaces of some substrates may be treated first to remove or change composition of a surface layer, which may be of a different material than a basal layer of the substrate. Alternatively, the same surface layer may be untreated or mechanically patterned before being contacted with the curable silicone composition and/or ECSA. Examples of surface layers that might be removed, alternatively left on, are metal oxide layers, protective coatings (e.g., organic coatings applied to metals that are prone to oxidation when exposed to ambient air), and powders such as powder residues that may have been deposited on the substrate be mechanical etching of the substrate. Examples of metal substrates are the electrically conductive metals and metal alloys described before, alternatively aluminum, copper, gold, niobium, palladium, platinum, silver, stainless steels, tantalum, and titanium. The surface layer of the substrate receiving the curable silicone composition or ECSA is a material that is capable of chemically bonding to the ECSA, which after being prepared by curing the curable silicone composition thereon is adhered to the material such that the adhesive strength is achieved. The ECSA may also provide adhesion to a variety of different organic polymer substrates that have first been primed or treated. Examples of organic polymer substrates that may be primed or treated to form a surface thereon for adhering to the ECSA are polyethylene and polypropylene. If the surface layer is treated (primed), the priming or treating the surface of the substrate may comprise treating a working portion of the surface thereof with an adhesion promoter or by chemical etching, mechanical etching, or plasma treating the working portion of the surface. Examples of suitable adhesion promoters are OFS 6040 XIAMETER, DOW CORNING P5200 Adhesion Promoter, and 1200 OS Primer Clear. Generally, increasing curing temperature and/or curing time will improve (i.e., increase) adhesion.

Different embodiments of the ECSA may be compared by characterizing their adhesive strength on a same substrate material such as a particular silica glass substrate according to the Peel Resistance Test Method described later. When the substrate material is an unprimed or untreated substrate, alternatively a substrate that has been previously primed or treated, the ECSA may be characterizable by an adhesive strength of at least 0.3 Newton (N) when measured on silica glass substrate according to the Peel Resistance Test Method. Alternatively, the ECSA may be characterizable by an adhesive strength of at least 0.1 N, alternatively at least 0.3 N, alternatively at least 0.5 N, alternatively at least 1.0 N. The ECSA may have any maximum adhesive strength. In some embodiments the ECSA may have a maximum adhesive strength of 5 N, alternatively 2 N, alternatively 1 N, alternatively 0.3 N. The adhesive strength value of a particular ECSA may vary depending on the material of the substrate. For purposes of characterizing an embodiment of the curable silicone composition after curing as being an ECSA, the substrate may be borosilicate silica glass. Different ECSAs may be characterized or compared by their adhesive strength according to the Peel Resistance Test Method when measured on a same substrate such as the borosilicate silica glass substrate. The silica glass may be Eagle XG silica glass (e.g., HS-20/40) from Corning Inc., Corning, N.Y., USA.

The ECSA independently may be employed in some applications as an adhesive but not as a means for conducting electrical current, such applications including using the ECSA for adhering same or different substrates comprising non-electrically conductive materials to each other. Reiterated, the use of the ECSA as an adhesive may include applications wherein the ECSA does not function or need to function to conduct electric current. Alternatively, the ECSA may be used in some applications as an adhesive and, at least periodically, as a means for conducting electric current between at least two electrical components of an electrical device. The at least two electrical components have opposing surfaces between which contact the ECSA. The periods during which the electric current may be conducted therebetween are when the electrical components or electrical components and electrical device are electrically active. Alternatively, the ECSA may be employed in some applications as a means for conducting electric current between at least two electrical components of an electrical device, but not as an adhesive for adhering the electrical components to each other. Reiterated, the use of the ECSA as a means for conducting electric current may between at least two electrical components of an electrical device may include applications where the electrical components are being held in electrical operative contact to the ECSA via a means other than adhesive action. Examples of such other non-adhesive means are where the electrical components are disposed in friction fit with each other or a common housing, a mechanical fastening means such as an externally screw-threaded fastener, solder (limited to contact with a very minor areas of the opposing surfaces of the electrical components), and a clamp.

The theoretical total concentration of silver in the ECSA, assuming complete removal of the hydrocarbon vehicle during curing of the curable silicone composition to give the ECSA, may be calculated as described later. In some embodiments the theoretical total concentration of silver in the ECSA is from 55 to 65 wt %, alternatively from 56.0 to 64.0 wt %, alternatively from 56.6 to 63.7 wt %, alternatively from 55.0 to 59.8 wt %, alternatively from 60.0 to 65.0 wt %.

An electrical device comprising first and second electrical components having opposing surfaces and the ECSA disposed between and in adhering operative contact with the opposing surfaces of the first and second electrical components; wherein the first and second electrical components are disposed for electrical operative communication with each other via the ECSA; and wherein the ECSA is characterizable by a volume resistivity of less than 0.0010 Ohm-centimeter, or any one of the aforementioned volume resistivity ranges described before. The ECSA binds the electrical components together and facilitates transfer of electric current between them via the ECSA during operation of the electrical device. A wide variety of electrical devices may employ the ECSA. The opposing surfaces of the first and second electrical components may be surfaces of an untreated substrate as described above. Alternatively, one or both of the opposing surfaces of the first and second electrical components may be surfaces of substrates that may have previously been primed or treated to form a surface thereon for adhering to the ECSA. Examples of electrical devices that may be manufactured with the curable silicone composition and ECSA are electrical components such as antenna, attenuators, light ballast, batteries, bimetallic strips, brushes, capacitors, electrochemical cells, control boards, instrument panels, distributors, electrographs, electrostatic generators, electronic filters, light flashers, fuses, inductors, jacks, plugs, electrostatic precipitators, rectifiers, relays, resistors, spark arrestors, suppressors, terminals, and electronics circuit board wiring patterns. Examples of such electrical devices also include higher order electrical devices, which may contain a plurality of such electrical components. The higher order electrical devices include photovoltaic cell modules and panels, and electronic devices such as computers, tablets, routers, servers, telephones, and smartphones. The use of the ECSA in the electrical devices is not particularly limited, and for example the ECSA may be used in place of any ECA of ad rem prior art electrical device.

A method of manufacturing the electrical device comprising the first and second electrical components having surfaces and the ECSA, the method comprising depositing the curable silicone composition onto one or both surfaces of the first and second electrical components, and orienting the first and second electrical components so that their surfaces are opposing each other to give a preassembly comprising the curable silicone composition disposed between and in physical contact with the opposing surfaces of the first and second electrical components; and curing the curable silicone composition between the opposing surfaces of the first and second electrical components to give the electrical device. The depositing may be performed in any suitable manner. E.g., a suitable manner of the depositing comprises disposing all of the curable silicone composition on a surface of one, but not both, of the first and second electrical components, and then bringing the disposed curable silicone composition in opposing contact to the surface of the other one (i.e., the one lacking the composition) of the first and second electrical components to give the preassembly. Another suitable manner of the depositing comprises disposing a first portion of the curable silicone composition on one of the surfaces of the first and second electrical components, disposing a second portion of the curable silicone composition on the other one of the surfaces of the first and second electrical components, and then bringing the first and second portions of the disposed curable silicone composition in opposing contact to give the preassembly. The first and second portions of the curable silicone composition may be the same or different in amount, composition, batch, age, extent of curing, and/or other property (e.g., temperature). The invention contemplates that still other suitable manners may be used so long as the preassembly is produced therewith. It is generally known in the art how to prepare different electrical devices comprising an ECSA prepared by curing a curable silicone composition. The electrical device comprises the first and second electrical components and the electrically conductive silicone adhesive disposed between and in adhering operative contact with the opposing surfaces of the first and second electrical components such that the first and second electrical components are disposed for electrical operative communication with each other via the electrically conductive silicone adhesive. The ECSA in the electrical device is characterizable by a volume resistivity of less than 0.0010 Ohm-centimeter measured according to Volume Resistivity Test Method.

The manufacturing method may comprise manufacturing more than one electrical device wherein curable silicone compositions having different rheologies are employed for manufacturing different ones of the electrical devices. For example, the method may comprise depositing a first curable silicone composition having a first thixotropic Index($\eta_1/\eta_{10}$) onto the opposing surfaces of the first and second electrical components to give a first preassembly comprising the first curable silicone composition disposed between and in physical contact with the opposing surfaces of the first and second electrical components; and curing the first curable silicone composition between the opposing surfaces of the first and second electrical components to give a first electrical device; adjusting the rheology of the first curable silicone composition to give a second curable silicone composition having a second thixotropic Index($\eta_1/\eta_{10}$), wherein the first thixotropic Index($\eta_1/\eta_{10}$) and second thixotropic Index($\eta_1/\eta_{10}$) differ from each other by at least 0.3, alternatively at least 0.5, alternatively at least 1, alternatively at least 2, alternatively at least 3, alternatively at least 4, alternatively at least 5, all as a result of the adjusting; and depositing the second curable silicone composition onto opposing surfaces of third and fourth electrical components to give a second preassembly comprising the second curable silicone composition disposed between and in physical contact with the opposing surfaces of the third and fourth electrical components; and curing the second curable silicone composition between the opposing surfaces of the third and fourth electrical components to give a second electrical device. Each depositing step may independently be performed in any suitable manner as described before to independently give the first and second preassemblies. A portion of a master batch of the first curable silicone composition may be used in the manufacture of the first electrical device and another portion of the master batch of the first curable silicone composition may be used in the adjusting step. The first electrical device may be manufactured before, alternatively after the adjusting step. Each of the first and second thixotropic Index($\eta_1/\eta_{10}$) values independently may be between 3 and 10. The first and second electrical components of the first electrical device are disposed for electrical operative communication with each other via a first ECSA, wherein the first ECSA is prepared by the curing of the first curable silicone composition and is characterizable by a volume resistivity of less than 0.0010 Ohm-centimeter. The third and fourth electrical components of the second electrical device are disposed for electrical operative communication with each other via a second ECSA, wherein the second ECSA is prepared by the curing of the second curable silicone composition and is characterizable by a volume resistivity of less than 0.0010 Ohm-centimeter. The volume resistivity of the first and second ECSAs may be the same, alternatively may differ from each other by less than 0.0001 Ohm-cm, alternatively less than 0.00005 Ohm-cm, alternatively less than 0.00002 Ohm-cm.

The manufacturing method may comprise manufacturing more than one electrical device wherein the depositing and/or curing conditions (collectively, manufacturing conditions) are different. For example, the depositing and/or curing conditions may be different from each other in at least one of temperature of the curable silicone composition, rate of flow of the curable silicone composition, cure time of the curable silicone composition, orientation of the substrate when in contact with the curable silicone composition, and chemical composition or structure of the surfaces of the first and second substrates. The rheology may be adjusted without increasing the total concentration of electrically conductive core such that the thixotropic index($\eta_1/\eta_{10}$) values before and after the rheology adjustment are each between 3 and 10 and differ from each other by at least 0.3, alternatively at least 0.5, alternatively at least 1, alternatively at least 2, alternatively at least 3, alternatively at least 4, alternatively at least 5, all as a result of the adjusting.

As mentioned before, in any of the foregoing embodiments, the depositing the curable silicone composition onto the opposing surfaces of the first and second electrical components may comprise contacting the curable silicone composition to one or both surfaces, and bringing the surfaces into opposition to each other so that the curable silicone composition directly contacts both of the opposing surfaces. Likewise in any of the foregoing embodiments employing same, the depositing the curable silicone composition onto the opposing surfaces of the third and fourth electrical components may comprise contacting the curable silicone composition to one or both surfaces, and bringing the surfaces into opposition to each other so that the curable silicone composition directly contacts both of the opposing surfaces. The contacting of the curable silicone composition to the surfaces may be done sequentially or simultaneously. In the electrical device the first and second electrical components sandwich the curable silicone composition between their opposing surfaces.

The curable silicone composition may be applied to the surface(s) by various methods of deposition. Examples of suitable methods include printing through screen or stencil, dispensing, or other methods such as aerosol, ink jet, gravure, or flexographic, printing. The curable silicone composition may be applied to the surfaces to make direct physical and electrical contact to the first and second electrical components, alternatively the third and fourth electrical components. Curing the applied curable silicone composition gives the ECSA in direct physical, adhesive and electrical contact to the opposing faces, and enables electrical operative communication between the first and second electrical components, alternatively the third and fourth electrical components, via the ECSA.

Conditions for the curing typically comprise elevated temperature and lead to the substantial removal of the hydrocarbon vehicle. Substantially all of other ingredients of the curable silicone composition are, or react in situ to form components that are, less volatile under the curing conditions than is the hydrocarbon vehicle. Thus, the concentration of silver and other ingredients besides the hydrocarbon vehicle are usually higher in the ECSA than in the curable silicone composition. If the concentration of hydrocarbon vehicle is X wt % and total concentration of silver is Y1 wt % in the curable silicone composition, and assuming complete removal (100% removal) of the hydrocarbon vehicle, then theoretically the total concentration of silver in the ECSA would equal Y2 wt %=100×[Y1 wt %/(100 wt %−X wt %)]. As described, Y1 is from 50 to less than 59.4 wt % and X is from 4.0 to 20 wt %, all based on total weight of the curable silicone composition. Therefore, the theoretical total concentration of silver in the ECSA, assuming complete removal of the hydrocarbon vehicle during curing of the curable silicone composition to give the ECSA, may be from 55 to 65 wt %, alternatively from 56.0 to 64.0 wt %, alternatively from 56.6 to 63.7 wt %, alternatively from 55.0 to 59.8 wt %, alternatively from 60.0 to 65.0 wt %.

Depending on whether the curable organosiloxane composition is condensation curable, free radical curable or hydrosilylation curable as described earlier, conditions for the curing may further comprise exposure of the curable silicone composition to UV light, peroxides, metal-containing catalyst, and/or moisture. For example, curing the hydrosilylation-curable silicone composition typically comprises heating the hydrosilylation-curable organosiloxane containing the hydrosilylation catalyst to remove a substantial amount of the hydrocarbon vehicle and give the ECSA. The curing conditions may facilitate shrinkage of bulk volume of material during curing and result in improved (i.e., increased) packing of the electrically conductive filler and an ECSA with increased electrical conductivity, decreased volume resistivity, or both compared to an ECSA that is the same except having a hydrocarbon vehicle with a boiling point below 100° C. (e.g., 50° C.).

Some advantages and benefits of the present invention. In the present invention, the carbon nanotubes are believed to have minimal or no negative effect on electrical conductivity at their concentrations employed herein. While carbon nanotubes at very high loading levels generally may impart some electrical conductivity in a cured polymer that would otherwise not be electrically conductive if it lacked high loading of carbon nanotubes, instead the present invention advantageously employs the carbon nanotubes as a concentration-sensitive rheology modifier in the curable silicone composition at relatively low concentrations where the carbon nanotubes ultimately have no or minimal negative effect on electrical conductivity of the ECSA resulting from curing the curable silicone composition. The rheology of the curable silicone composition may be adjusted over a useful range in order to accommodate different rheology requirements of different applications for making electrical devices while keeping total silver concentration in the range of from 50 to <60 wt %, the total concentration of electrically conductive metal below 72 wt %, and while the volume resistivity of the resulting ECSA may be maintained below 0.001 Ohm-centimeter. For example, the rheology of the curable silicone composition may be characterizable by a Thixotropic Index($\eta_1/\eta_{10}$) of at least 3 measured according to TI Test Method. For example, the curable silicone composition is advantageously characterizable by a thixotropic index that is adjustable from 3 to 10 (3.0 to 10.0, for example from 3.8 to 9) without increasing the total concentration of electrically conductive filler, and while the curable silicone composition remains curable to an ECSA having a volume resistivity of less than 0.001 Ohm-centimeter and the total concentration of silver in the curable silicone composition is from 50 to <60 wt %. Further, while the thixotropic index may be adjusted in this range, the volume resistivity of the resulting ECSA may remain virtually unchanged. Further, the present invention may achieve this advantage without using copper, gold, or copper and gold in the curable silicone composition and ECSA. Therefore, in some embodiments, the curable silicone composition and ECSA composition lack copper, gold, or copper and gold.

The manner of adjusting of the thixotropic index may comprise adjusting the combined wt % portion of the silver particles and Ag-coated core particles relative to the wt % proportion of the carbon nanotubes so long as the concentrations of the silver particles, Ag-coated core particles, total silver, and carbon nanotubes remain within the wt % ranges described herein therefor; alternatively raising or lowering the concentration of carbon nanotubes in the curable silicone composition so long as the concentration remains within the wt % range described herein for the carbon nanotubes therein, alternatively raising or lowering the concentration of the hydrocarbon vehicle so long as the concentration of the hydrocarbon vehicle remains within the wt % range described herein for the hydrocarbon vehicle, or any combination of two, alternatively three thereof. Such manners of adjusting are contemplated so long as the thixotropic index changes by at least 0.3, alternatively at least 0.5, alternatively at least 1, alternatively at least 2, alternatively at least 3, alternatively at least 4, alternatively at least 5, all as a result of the adjusting, while the thixotropic index remains greater than 3, the total concentration of the electrically conductive filler does not increase, and the curable silicone composition remains curable to an ECSA having a volume resistivity of less than 0.001 Ohm-cm, alternatively below 0.00099 Ohm-cm, alternatively <0.00090 Ohm-cm, alternatively <0.00080 Ohm-cm, alternatively <0.00070 Ohm-cm, alternatively <0.00065 Ohm-cm. Even when the concentration of carbon nanotubes is raised or lowered, the thixotropic index of the ECSA prepared from the curable silicone composition may change by a significant amount (e.g., 1 or more) while unexpectedly the volume resistivity of the resulting ECSA may remain virtually unchanged (e.g., may change by from 0 to 0.0001, alternatively from 0 to 0.0005, alternatively from 0 to 0.00002 Ohm-cm). The adjusting may be achieved without varying concentration of the hydrocarbon vehicle in the curable silicone composition, alternatively the concentration of the hydrocarbon vehicle in the curable silicone composition may be varied by itself or in combination with varying the electrically conductive filler.

Therefore, in some embodiments the concentration of carbon nanotubes in the curable silicone composition is raised or lowered by at least 0.1 wt %, alternatively at least 0.2 wt %, alternatively at least 0.5 wt %; and the thixotropic index of the ECSAs prepared from each of such curable silicone compositions changes by 0.3 or more, alternatively 0.5 or more, alternatively 1.0 or more, alternatively 2 or more, alternatively 3 or more, alternatively 4 or more, alternatively 5 or more, all as a result of the raising or lowering, while the volume resistivity of the ECSAs remain unchanged or remain within 0.0001 Ohm-cm, alternatively within 0.00005 Ohm-cm, alternatively within 0.00002 Ohm-cm of each other. In some embodiments the thixotropic index of the ECSAs prepared from each of such curable silicone compositions changes by 0.3 or more, alternatively 0.5 or more, alternatively 1.0 or more while the volume resistivity of the ECSAs remain <0.001 Ohm-cm, alternatively below 0.00099 Ohm-cm, alternatively <0.00090 Ohm-cm, alternatively <0.00080 Ohm-cm, alternatively <0.00070 Ohm-cm, alternatively <0.00065 Ohm-cm. In some embodiments the concentration of the hydrocarbon vehicle in the curable silicone composition is varied by at least 0.5 wt %, alternatively at least 1 wt %, alternatively at least 2 wt %, alternatively at least 5 wt %; and the thixotropic index of the ECSAs prepared from each of such curable silicone compositions changes by 0.3 or more, alternatively 0.5 or more, alternatively 1.0 or more while the volume resistivity of the ECSAs remain <0.001 Ohm-cm, alternatively below 0.00099 Ohm-cm, alternatively <0.00090 Ohm-cm, alternatively <0.00080 Ohm-cm, alternatively <0.00070 Ohm-cm, alternatively <0.00065 Ohm-cm. In varying the foregoing proportions or amounts, at least 2 different ECSAs, alternatively at least 3 different ECSAs, alternatively at least 4 different ECSAs are prepared and compared to each other to establish the ad rem advantage.

In the embodiments of the immediately foregoing paragraph, the thixotropic index of the curable silicone composition may be adjusted in the range from 4 to 9, e.g., from 3.8 to 9. The concentration of carbon nanotubes may be adjusted in the range from 0.4 to 2.2 wt %, alternatively from 0.50 to 2.0 wt. The total silver concentration may be maintained in the range of from 53 to 58 wt %, e.g., from 52.9 to 58.1 wt %. The total electrically conductive metal concentration may be maintained in the range from 68.0 to 71.0 wt %. The curable silicone compositions may remain curable to ECSAs having a volume resistivity of less than (<) 0.00090 Ohm-cm, alternatively <0.00080 Ohm-cm, alternatively <0.00070 Ohm-cm, alternatively <0.00065 Ohm-cm, alternatively <0.00050 Ohm-cm, alternatively <0.00020 Ohm-cm. The foregoing wt % are based on weight of the curable silicone composition. Embodiments of the present invention method include such adjusting, ranges and values. For example, the curable silicone composition may be characterizable by a combination of: total silver concentration from 52.9 to 58.1 wt %; total electrically conductive metal concentration is from 68.0 to 71.0 wt %; concentration of carbon nanotubes of from 0.4 to 2.2 wt %, alternatively from 0.50 to 2.0 wt %; a thixotropic index from 3.8 to 9; and volume resistivity of from 0.00010 to 0.00090 Ohm-cm, alternatively from 0.00014 to 0.00087 Ohm-cm. The ECSA composition may be prepared therefrom.

Such an adjustable curable silicone composition is useful for developing different curable precursor formulations that meet the varied rheology needs of electrical component/device manufacturing conditions while retaining the ECSA electrical properties needed by end-users of the electrical component/device device. For example, the curable silicone composition has rheology characteristics that are useful for screen printing thereof, including for screen printing different types of electrical components/devices. The curable silicone composition has sufficient viscosity such that it does not exhibit too much slump, bleeding, dripping, and/or filler settling during screen printing thereof. Additionally, the curable silicone composition may not have too much viscosity for successful screen printing. The curable silicone composition has adjustable rheology in order to meet the diverse needs of manufacturers of different electrical devices such as photovoltaic devices and electronic circuit boards while retaining the resulting ECA's electrical properties needed by the device users.

Alternatively or additionally, the curable silicone composition has sufficient flexibility for end-use application requiring low stress interconnections. The curable silicone composition and ECSA enhances durability of embodiments of the electrical devices, which include electronic devices that are exposed to wide temperature variations.

While the main advantages of the invention may be realized with any curable silicone composition described herein, embodiments of the invention wherein the curable silicone composition and its curable organosiloxane composition comprise the hydrosilylation-curable organosiloxane, and after curing the ECSA comprises the at least partially hydrosilylation cured organosiloxane, may have additional advantages compared to other invention embodiments wherein the curable silicone composition and its curable organosiloxane composition comprise the condensation curable silicone composition and its condensation curable organosiloxane composition and after curing the ECSA comprises an at least partially condensation cured organosiloxane. For example, the hydrosilylation curable silicone composition typically creates no cure by-product that would cause corrosion or voiding in the resulting hydrosilylation cured ECSA, whereas the condensation curable embodiments may generate some corrosive (e.g., acetic acid) and/or volatile (e.g., methanol) by-products, which may be removed if desired. Also, the hydrosilylation curable silicone composition typically cures at about the same rate or time throughout its bulk volume, whereas the condensation curable silicone composition typically cures from outside inward. Further, the hydrosilylation cured ECSA is reversion resistant, whereas the condensation cured ECSA is less so. Therefore, while any curable silicone composition may be used, the hydrosilylation curable silicone composition may provide further benefits.

Determining numerical property values: for purposes of the present invention and unless indicated otherwise, the numerical property values used herein may be determined by the following procedures.

Determining adhesive strength: for purposes of the present invention and unless indicated otherwise, a Peel Resistance Test Method that is in agreement with the test method described in ASTM D6862-04 (Standard Test Method for 90 Degree Peel Resistance of Adhesives) has been used. Peel Resistance Test Method: uses a 90-degree peel test to determine the resistance-to-peel strength of a test adhesive bonding a rigid adherent (substrate such as silica glass) and a flexible adherent (e.g., 2 mm wide Cu wire), For purposes of this test method, surfaces of the adherents do not undergo surface priming or treatment prior to adhesive application thereto. Test adhesive is screen printed onto the rigid adherent through apertures of dimension 0.5 mm×114 mm×0.25 mm. Flexible 2 mm wide Cu wire is placed on top of the screen printed test adhesive, and the resulting structure is heat treated at 150° C. for 15 minutes in air environment to give a test sample. The 90-degree peel resistance measurement takes place on a gripping fixture of an INSTRON electromechanical testing system, which gripping fixture allows a constant 90 degree peel angle to be maintained during the test. The test sample is positioned on the INSTRON table, and clamped down on both sides of the test area at a distance of approx 5 mm to minimize flexure. About 3 centimeter (cm) length of the Cu wire is standing out of the measurement zone (i.e., test area where the Cu wire contacts the rigid adherent) and is used for attaching the test sample to a pull tester. For every measurement the Cu wire is bent at a 2 mm distance from the measurement zone and inserted into the gripping fixture. Either an end portion of the Cu wire overhangs the rigid adherent, or the end portion is pulled up by hand from the rigid adherent to debond (physically separate) the end portion of the Cu wire from the rigid adherent without debonding all of the Cu wire therefrom, and the debonded end portion is disposed into the gripping fixture. The force needed to bend the Cu wire is not taken into account since only data obtained with the same type of Cu wire are compared. A 100 Newton (N; equivalent to 20 lbs) load cell and a strain rate of 0.5 inch per minute (1.27 cm/minute) is used and the average peel force over a 15 mm length of travel of the test sample is measured. At least 4 specimens are measured for each test sample to obtain an average peel force, which is what is reported.

Determining boiling point: measure boiling point by distillation at standard atmospheric pressure of 101.3 kilopascals (kPa).

Determining dynamic viscosity: for purposes of the present invention and unless indicated otherwise, use dynamic viscosity that is measured at 25° C. using a rotational viscometer such as a Brookfield Synchro-lectric viscometer or a Wells-Brookfield Cone/Plate viscometer. The results are generally reported in centipoise. This method is based on according to ASTM D1084-08 (Standard Test Methods for Viscosity of Adhesives) Method B for cup/spindle and ASTM D4287-00(2010) (Standard Test Method for High-Shear Viscosity Using a Cone/Plate Viscometer) for cone/plate. Dynamic viscosity for purposes of determining thixotropic index is measured according to the TI Test Method described later.

Determining kinematic viscosity: use test method ASTM-D445-11a (Standard Test Method for Kinematic Viscosity of Transparent and Opaque Liquids (and Calculation of Dynamic Viscosity)) at 25° C. Expressed in cSt or $mm^2/s$ units.

Determining state of matter: Characterize state of matter as solid, liquid, or gas/vapor at 20° C. and a pressure of 101.3 kPa.

Determining volume resistivity: The volume resistivity of ECSA test samples reported in the Examples below was determined using the following Volume Resistivity Test Method. The volume resistivity was determined using a four-point-probe instrument, GP 4-TEST Pro, from GP Solar GmbH, Germany. This instrument has a line resistance probe head and incorporates Precise Keithley electronics for current sourcing and voltage measurement. The line resistance probe head is constructed to measure electrical resistance through a 5 cm distance along a conductive strip the ECSA test sample. An aliquot of the test material was deposited on non-conductive substrate (e.g., silica glass or ceramic) by screen printing through apertures of dimension 5 mm×60 mm×0.25 mm. This formed a uniform line having an area of 5 mm×60 mm=300 $mm^2$. The spread test material was thermally cured by conveying it through an oven set to a temperature of 150° C. under ambient (air) atmosphere for 15 minutes to produce a test sample of the material (e.g., ECSA The voltage drop between the two inner probe tips was then measured at a selected current to provide a resistance value in ohms (Ω).

The initial volume resistivity of the cured composition was calculated using the equation ρ=R(W×T/L) where ρ is the volume resistivity in Ohm-centimeters (Ω-cm), R is the resistance in ohms (Ω) of the cured composition measured between two inner probe tips spaced 5 cm apart, W is the width of the cured layer in cm, T is the thickness of the cured layer in cm, and L is the length of the cured layer between the inner probes in cm. The thickness of the cured layer was determined using a micrometer (Ono Sokki digital indicator number EG-225). If desired, a cross sectional area might be determined more accurately using a Zygo 7300 white light interferometer. Even so, all of the thickness measurements in the below examples were determined with the micrometer. Volume resistivity (ρ) in Ω-cm units represents the average value of three measurements each performed on identically prepared test specimens. These measurements have a relative error of less than 10 percent.

Determining thixotropic index($\eta_1/\eta_{10}$): The thixotropic index($\eta_1/\eta_{10}$) is determined using the following TI Test Method. Measure dynamic viscosity (q) in Pascal-seconds (Pa·s) at 25° C. using an ARES G2 Parallel Plate Rheometer with 40 millimeter diameter plates and a gap of 1 millimeter (Rheometer). Agitate a test sample for 20 seconds at 1,200 revolutions per minute (rpm) with a SPEEDMIXER dual asymmetric centrifugal laboratory mixer (model no. DAC 150 FVZ-K, Haushild & Co. KG, Hamm, Germany). Then immediately load the agitated test sample into the Rheometer for a conditioning step and then a flow sweep step. During the conditioning step, mix the test sample for 300 seconds at a shear rate of 0.001 radians per second to give a conditioned test material. Then during the flow sweep step, measure dynamic viscosity of the conditioned test material at shear rates ranging from 0.001 to 100 radians per second (rads$^{-1}$ or rad/s), recording at least five data points per shear rate decade (i.e., record at least five data points at 0.001 rad/s, at least five data points at 0.01 rad/s, etc. up to and including at least five data points at 100 rad/s). The thixotropic index($\eta_1/\eta_{10}$) is calculated by dividing the dynamic viscosity values in Pa-s at shear rates of 1 and 10 rad/s, respectively Determining weight percent (wt %): base weight percent of an ingredient of a composition, mixture, or the like on weights of ingredients added to prepare, and total weight of, the composition, mixture, or the like.

Ingredients used in the examples follow.

Hydrocarbon vehicle (HV1) was an isoalkanes mixture containing 80 to 81% ($C_{16}$)isohexadecanes, 3% ($C_{13}$)isotridecanes, and 16 to 17% ($C_{12}$)isododecanes.

Silver particles (Ag1) were fatty acid ester lubricated silver flakes having a mean particle size of 3.9 μm, surface area of 0.86 m$^2$/g, apparent density of 1.58 g/cm$^3$, and a tap density of 3.02 g/cm$^3$.

Silver-coated nickel particles Ag/Ni-40, Ag/Ni-30, and Ag/Ni-15 had concentrations of silver in Ag/Ni-40, Ag/Ni-30, and Ag/Ni-15 were 40 wt %, 30 wt %, and 15 wt %, respectively, based on total weight of the silver-coated nickel particles. The Ag/Ni-40, Ag/Ni-30, and Ag/Ni-15 had mean particle sizes of 8 to 9 μm, 15 to 16 μm, and 35 to 45 μm, respectively. The Ag/Ni-40, Ag/Ni-30, and Ag/Ni-15 had apparent density of 3.0 g/cm$^3$, 3.1 g/cm$^3$, and 3.4 g/cm$^3$, respectively.

Multi-walled carbon nanotubes (MWCNT1) had an outer diameter of from 50 to 100 nm and length of from 5 to 20 μm. Derivatized carbon nanotubes (DCNT1) were graphenated MWCNT that had >99.9 wt % purity, and an outer diameter of from 5 to 20 nm and a length of from 5 to 50 μm.

Vinyl-functionalized Polydimethylsiloxane (VFPDMS1): this primary organosiloxanes was a vinyl-functionalized polydimethylsiloxane having dynamic viscosity of from 40,000 to 70,000 Pa·s.

A chain extender/crosslinker was a trimethylsiloxy-terminated dimethyl methylhydrogensiloxane (CE/CL1) liquid having a dynamic viscosity of 55 cSt (55 mm$^2$/s). Another chain extender/crosslinker was dimethylvinylsiloxy-terminated methylhydrogencyclosiloxane (CE/CL2).

Adhesion promoter (AP1) was an a 3:2 (wt/wt) mixture of bis(alpha,omega-glycidoxyalkyl)-dialkyl/(alkyl,alkenyl)siloxane adhesion promoter with a kinematic viscosity of 17 cSt (17 mm$^2$/s) and bis(alpha,omega-glycidoxyalkyl-D3 to D6 alkyl,hydrogencyclosiloxane), wherein there are two bis(alpha,omega-glycidoxyalkyl-D3 to D6 organo,hydrogencyclosiloxanyl moieties, which are linked to each other via an alkylene-dialkylsiloxanyl-alkylene linker.

Catalyst (CAT1) was a microencapsulated platinum catalyst in the form of shell-core particles, wherein CAT1 contained 0.008 wt % Pt, wherein the encapsulant or shell was a cured vinyl-terminated polydimethylsiloxane and the core comprised a platinum-ligand complex.

Silica glass beads (SGB1) were solid spherical soda-lime glass particles having a maximum diameter of from 75 to 90 μm and a specific gravity of from 2.3 to 2.7.

Non-limiting examples of the invention follow. They illustrate some specific embodiments and aforementioned advantages. The invention provides additional embodiments that incorporate any one limitation of the Examples, which limitations thereby may serve as a basis for amending claims.

Preparation Method: The curable silicone compositions of the examples were prepared by mixing the Vinyl-functionalized Polydimethylsiloxane 1 and either the multi-walled CNTs or derivatized CNTs to form a master batch (MB1). Mixing to form MB1 was done with an EXAKT Three Roll Mill (model no. 80E, Exakt Advanced Technology) in 5 passes using a 5 to 70 μm gap at 30 revolutions per minute (rpm). To a pot of a 0.5 liter planetary mixer (Custom Milling and Consulting, Fleetwood, Pa., USA) add HV1; AP1; Ag1; either Ag/Ni-40, Ag/Ni-30, or Ag/Ni-15; an aliquot of MB1; additional Vinyl-functionalized Polydimethylsiloxane 1; and, if used, solid silica glass beads (SGB1); and mix resulting contents to wet-out and disperse electrically conductive filler (Ag1; Ag/Ni-40, Ag/Ni-30, or Ag/Ni-15; and either MWCNT1 or DCNT1) to give a precursor mixture. To the precursor mixture add the chain extender/crosslinker CE/CL1 (or both CE/CL1 and CE/CL2) and the microencapsulated platinum catalyst (CAT1), and mix gently to prevent heating, and de-air the pot to give a curable silicone composition of any one of Examples 1 to 13. The amounts of the ingredients of the hydrosilylation-curable organosiloxane and the curable silicone composition prepared therefrom were chosen so as to give the wt % concentrations listed below in Tables 1 and 2, respectively.

TABLE 1

Hydrosilylation-curable organosiloxane compositions of Examples 1 to 13.

| Ex. No. | VFPMDS1 (wt %) | CE/CL1 (wt %) | AP1 (wt %) | CAT1 (wt %) |
|---|---|---|---|---|
| 1 | 74.3 | 4.33 | 7.11 | 14.3 |
| 2 | 73.1 | 4.52 | 7.43 | 14.9 |

TABLE 1-continued

Hydrosilylation-curable organosiloxane compositions of Examples 1 to 13.

| Ex. No. | VFPMDS1 (wt %) | CE/CL1 (wt %) | AP1 (wt %) | CAT1 (wt %) |
|---|---|---|---|---|
| 3 | 74.3 | 4.33 | 7.11 | 14.3 |
| 4 | 74.3 | 4.31 | 7.15 | 14.3 |
| 5 | 74.3 | 4.55 | 7.15 | 14.3 |
| 6 | 73.8 | 4.27 | 7.48 | 14.3 |
| 7 | 74.3 | 4.33 | 7.11 | 14.3 |
| 8 | 74.3 | 4.33 | 7.11 | 14.3 |
| 9 | 74.3 | 4.33 | 7.11 | 14.3 |
| 10 | 74.3 | 4.33 | 7.11 | 14.3 |
| 11 | 74.3 | 4.33 | 7.11 | 14.3 |
| 12 | 74.3 | 4.33 | 7.11 | 14.3 |
| 13 | 74.3 | 4.30 | 7.14 | 14.3 |

TABLE 2 curable silicone compositions of Examples 1 to 13.

| Ex. No. | Ag1 (wt %) | Ag/Ni (wt %) | CNTs (wt %) | Hydrocarbon Vehicle (wt %) | Organosiloxane* (wt %) | Other (wt %) |
|---|---|---|---|---|---|---|
| 1 | 50.0 | Ag/Ni-40 (18.0) | DCNT1 (2.0) | HV1 (6.7) | 23.3 | None |
| 2 | 51.0 | Ag/Ni-30 (19.1) | MWCNT1 (0.90) | HV1 (6.7) | 22.3 | None |
| 3 | 50.0 | Ag/Ni-30 (19.1) | MWCNT1 (0.90) | HV1 (6.7) | 23.3 | None |
| 4 | 50.0 | Ag/Ni-40 (18.0) | DCNT1 (1.5) | HV1 (10.0) | 19.0 | SGB1 (1.5) |
| 5 | 50.0 | Ag/Ni-40 (18.0) | DCNT1 (1.0) | HV1 (10.0) | 20.0 | SGB1 (1.0) |
| 6 | 51.0 | Ag/Ni-40 (19.1) | MWCNT1 (0.80) | HV1 (10.0) | 17.0 | SGB1 (2.1) |
| 7 | 50 | Ag/Ni-15 (19.0) | MWCNT1 (1.0) | HV1 (6.7) | 23.0 | None |
| 8 | 50 | Ag/Ni-30 (19.5) | MWCNT1 (0.50) | HV1 (6.7) | 23.4 | None |
| 9 | 50 | Ag/Ni-30 (19.2) | MWCNT1 (0.80) | HV1 (6.7) | 23.4 | None |
| 10 | 50 | Ag/Ni-30 (18.9) | MWCNT1 (1.10) | HV1 (6.7) | 23.4 | None |
| 11 | 50 | Ag/Ni-30 (18.2) | MWCNT1 (1.70) | HV1 (6.7) | 23.4 | None |
| 12 | 50 | Ag/Ni-30 (18.0) | MWCNT1 (2.00) | HV1 (6.7) | 23.4 | None |
| 13 | 50 | Ag/Ni-40 (20.0) | DCNT1 (1.0) | HV1 (6.4) | 22.6 | None |

*See Table 1 unless noted otherwise.

The curable silicone compositions (CSCs) of Examples 1 to 13 may be directly characterized by thixotropic index, total silver concentration, total electrically conductive metal concentration, and indirectly by characterizing the resulting ECSA by volume resistivity, adhesion, and theoretical concentration of silver if all of hydrocarbon vehicle HV1 had been removed during curing. These characterizations are shown below in Table 3.

TABLE 3 direct and indirect characterizations of curable silicone compositions (CSC) of Examples 1 to 13.

| Ex. No. | CSC TI ($\eta_1/\eta_{10}$) | CSC Total [Ag] (wt %) | ECSA ρ (Ohm-cm) | Theoretical ECSA Total [Ag] (wt %) | Total e-conductive Metal (wt %) |
|---|---|---|---|---|---|
| 1 | 5.17 | 57.2 | 0.000563 | 61.3 | 68.0 |
| 2 | 5.48 | 56.7 | 0.000616 | 60.8 | 71.0 |
| 3 | 5.25 | 55.7 | 0.000796 | 59.7 | 69.1 |
| 4 | N/d | 57.2 | 0.000164 | 63.6 | 68.0 |
| 5 | N/d | 57.2 | 0.000447 | 63.6 | 68.0 |
| 6 | N/d | 56.5 | 0.000150 | 63.0 | 70.1 |
| 7 | 5.3 | 52.9 | 0.000808 | 56.7 | 69.0 |
| 8 | 3.8 | 55.9 | 0.000795 | 59.9 | 69.5 |
| 9 | 4.9 | 55.8 | 0.000827 | 59.8 | 69.2 |
| 10 | 6 | 55.7 | 0.000789 | 59.7 | 68.9 |
| 11 | 8.6 | 55.5 | 0.000862 | 59.5 | 68.2 |
| 12 | 9 | 55.4 | 0.000812 | 59.4 | 68.0 |
| 13 | 3.8 | 58.0 | 0.000485 | 62.0 | 70.0 |

CSC = curable silicone composition; ECSA = electrically conductive silicone adhesive; [Ag] = concentration of silver; N/d = not determined.

As illustrated by the foregoing examples and described above, the thixotropic index of the curable silicone composition may be adjusted in the range from 3 to 10 while keeping total silver concentration in the range of from 50 to <60 wt % and the total electrically conductive metal concentration below 72 wt %, and yet the volume resistivity of the resulting ECSA remains below 0.001 Ohm-centimeter. This adjusting may be performed by varying concentration of carbon nanotubes within a range from >0 to 5.0 wt %, for example from 0.4 to 2.2 wt % or from 0.50 to 2.0 wt %, alternatively any one of the aforementioned ranges thereof. In some embodiments, the thixotropic index of the curable silicone composition may be adjusted in the range from 4 to 9 (e.g., from 3.8 to 9) while keeping total silver concentration in the range of from 53 to 58 wt % (e.g., from 52.9 to 58.1 wt %) and the total electrically conductive metal concentration is from 68.0 to 71.0 wt %, while the curable silicone composition remains curable to an ECSA having a volume resistivity of less than (<) 0.00090 Ohm-cm, alternatively <0.00080 Ohm-cm, alternatively <0.00070 Ohm-cm, alternatively <0.00065 Ohm-cm, alternatively <0.00050 Ohm-cm, alternatively <0.00020 Ohm-cm. This latter adjusting may be performed by varying concentration of carbon nanotubes within a range of from 0.4 to 2.2 wt % (e.g., from 0.50 to 2.0 wt %). The foregoing wt % are based on weight of the curable silicone composition. Embodiments of the present invention method include such adjusting, ranges and values. For example, the curable silicone composition may be characterizable by a combination of: total silver concentration from 52.9 to 58.1 wt %; total electrically conductive metal concentration is from 68.0 to 71.0 wt %; concentration of carbon nanotubes of from 0.4 to 2.2 wt %, alternatively from 0.50 to 2.0 wt %; a thixotropic index from 3.8 to 9; and volume resistivity of from 0.00010 to 0.00090 Ohm-cm, alternatively from 0.00014 to 0.00087 Ohm-cm. The ECSA composition may be prepared therefrom.

The below claims are incorporated by reference here as correspondingly numbered aspects except where "claim" and "claims" are rewritten as "aspect" and "aspects." As in claims 3 to 5, each of aspects 3 to 5 is written to include each of its respective "Wherein" limitations. Also included here are additional aspects that are the same as aspects 3 to 5 except instead of each "Wherein" limitation the additional aspects may include as few as any one or more of the respective "Wherein" limitations. Aspects 2 to 8 are embodiments of aspect 1. The invention includes such numbered aspects 1 to 16. In some embodiments the invention is any one of the resulting aspects 1 to 16, alternatively any one of the resulting aspects 1 to 16 wherein the curable silicone composition and ECSA prepared therefrom be characterizable by an electrical conductivity (K) that is K $1.0\times10^4$ S/m, alternatively, K $1.0\times10^5$ S/m, alternatively K $1.0\times10^6$ S/m.

What is claimed is:

1. A curable silicone composition containing a curable organosiloxane composition, silver, and at least one electrically conductive metal other than silver, the curable silicone composition being characterized by a total silver concentration of from 50 to less than 60 weight percent and a thixotropic index from 3 to 10 measured according to TI Test Method while the composition remains curable to an electrically conductive silicone adhesive having a volume resistivity of less than 0.001 Ohm-centimeter measured according to Volume Resistivity Test Method without increasing the total concentration of silver and electrically conductive metal other than silver in the curable silicone composition to 72 weight percent or higher; wherein the curable silicone composition lacks carbon blacks.

2. The curable silicone composition of claim 1 further comprising electrically non-conductive particles.

3. The curable silicone composition of claim 1, wherein the curable silicone composition lacks electrically conductive filler other than silver particles, silver-coated core particles, and carbon nanotubes.

4. An electrically conductive silicone adhesive that is a product of curing the curable silicone composition of claim 1, wherein the electrically conductive silicone adhesive is characterized by a volume resistivity of less than 0.0010 Ohm-centimeter measured according to Volume Resistivity Test Method; wherein the electrically conductive silicone adhesive lacks carbon blacks.

5. The electrically conductive silicone adhesive of claim 4 characterized by an adhesive strength of at least 0.3 Newton when measured on silica glass substrate according to Peel Resistance Test Method.

6. An electrical device comprising first and second electrical components having opposing surfaces and the electrically conductive silicone adhesive of claim 4 disposed between and in adhering operative contact with the opposing surfaces of the first and second electrical components, wherein the first and second electrical components are disposed for electrical operative communication with each other via the electrically conductive silicone adhesive, wherein the electrically conductive silicone adhesive is characterized by a volume resistivity of less than 0.0010 Ohm-centimeter measured according to Volume Resistivity Test Method.

7. A method of manufacturing an electrical device comprising first and second electrical components having surfaces and an electrically conductive silicone adhesive, the method comprising depositing the curable silicone composition of claim 1 onto one or both surfaces of the first and second electrical components, and orienting the first and second electrical components so that their surfaces are opposing each other to give a preassembly comprising the curable silicone composition disposed between and in physical contact with the opposing surfaces of the first and second electrical components; and curing the curable silicone composition between the opposing surfaces of the first and second electrical components to give an electrical device comprising the first and second electrical components and an electrically conductive silicone adhesive disposed between and in adhering operative contact with the opposing surfaces of the first and second electrical components such that the first and second electrical components are disposed for electrical operative communication with each other via the electrically conductive silicone adhesive, wherein the electrically conductive silicone adhesive is characterized by a volume resistivity of less than 0.0010 Ohm-centimeter measured according to Volume Resistivity Test Method; wherein the electrically conductive silicone adhesive lacks carbon blacks.

8. A method of manufacturing an electrical device comprising first and second electrical components having surfaces and an electrically conductive silicone adhesive, the method comprising depositing the curable silicone composition of claim 1 onto one or both surfaces of the first and second electrical components, and orienting the first and second electrical components so that their surfaces are opposing each other to give a preassembly comprising the curable silicone composition disposed between and in physical contact with the opposing surfaces of the first and second electrical components; and curing the curable silicone composition between the opposing surfaces of the first and second electrical components to give an electrical device comprising the first and second electrical components and an electrically conductive silicone adhesive disposed between and in adhering operative contact with the opposing surfaces of the first and second electrical components such that the first and second electrical components are disposed for electrical operative communication with each other via the electrically conductive silicone adhesive, wherein the electrically conductive silicone adhesive is characterized by a volume resistivity of less than 0.0010 Ohm-centimeter measured according to Volume Resistivity Test Method, the method comprising manufacturing first and second electrical devices as described and under different depositing or curing conditions, the method comprising depositing a first curable silicone composition of claim 1 having a first thixotropic Index($\eta_1/\eta_{10}$) onto the opposing surfaces of the first and second electrical components to give a first preassembly comprising the first curable silicone composition disposed between and in physical contact with the opposing surfaces of the first and second electrical components; and curing the first curable silicone composition between the opposing surfaces of the first and second electrical components to give a first electrical device; adjusting the rheology of the first curable silicone composition to give a second curable silicone composition of claim 1 having a second thixotropic Index($\eta_1/\eta_{10}$), wherein the first thixotropic Index($\eta_1/\eta_{10}$) and second thixotropic Index($\eta_1/\eta_{10}$) differ from each other by at least 0.3, all as a result of the adjusting; and depositing the second curable silicone composition onto opposing surfaces of third and fourth electrical components to give a second preassembly comprising the second curable silicone composition disposed between and in physical contact with the opposing surfaces of the third and fourth electrical components; and curing the second curable silicone composition between the opposing surfaces of the third and fourth electrical components to give a second electrical device; wherein the method of manufacturing the first electrical device uses a first depositing condition and first curing condition; and the method of manufacturing the second electrical device uses a second depositing condition and second curing condition; and the second curable silicone composition is rheologically adjusted, electrical conductivity adjusted, or rheologically adjusted and electrical conductivity adjusted for use under the second depositing and/or curing conditions, wherein the first and second depositing conditions are different from each other, the first and second curing conditions are the same as or different from each other, or both; and wherein each electrically conductive silicone adhesive is characterized by a volume resistivity of less than 0.0010 Ohm-centimeter measured according to Volume Resistivity Test Method.

9. The method of claim 8, wherein the rheology is adjusted without increasing the total concentration of silver and electrically conductive metal other than silver such that the Thixotropic Index($\eta_1/\eta_{10}$) values before and after the rheology adjustment are each between 3 and 10 and differ from each other by at least 0.3.

10. The method of manufacturing of claim 8, wherein the depositing and/or curing of the first batch of the first curable silicone composition is done under a first manufacturing condition and the depositing and/or curing of the second curable silicone composition is done under a second manufacturing condition, wherein the first and second manufacturing conditions are different from each other in at least one of temperature of the first and second curable silicone compositions, rates of flow of the first and second curable silicone compositions, cure times of the first and second curable silicone compositions, orientation of the substrates when in contact with the respective first and second curable silicone compositions, and chemical compositions or structures of the surfaces of the first and second substrates.

11. A curable silicone composition comprising a blend of the following ingredients:
a hydrocarbon vehicle at a concentration of from 4.0 to 20 weight percent based on weight of the curable silicone composition, wherein the hydrocarbon vehicle is characterized by a boiling point from 100 to 360 degrees Celsius;
a curable organosiloxane composition at a concentration of from 10 to 40 weight percent based on weight of the curable silicone composition; and
electrically conductive filler consisting essentially of a combination of silver particles, silver-coated core particles, and carbon nanotubes, wherein the total concentration of silver is from 50 to less than 60 weight percent and carbon nanotubes are at a concentration of from greater than 0 to 5.0 weight percent, all based on weight of the curable silicone composition;
wherein the total concentration of all the ingredients of the curable silicone composition is 100.0 weight percent;
wherein the curable silicone composition is characterized by a Thixotropic Index($\eta_1/\eta_{10}$) of at least 3 measured according to TI Test Method; and
wherein the curable silicone composition is characterized by a volume resistivity less than 0.0010 Ohm-centimeter measured according to Volume Resistivity Test Method.

12. The curable silicone composition of claim 11 characterized by the following limitations:
wherein the hydrocarbon vehicle is a mixture of different hydrocarbon molecules wherein the lowest boiling hydrocarbon molecules have an initial boiling point greater than 150 degrees Celsius and the highest boiling hydrocarbon molecules have an end boiling point less than 300 degrees Celsius and the hydrocarbon vehicle is at a concentration of from 5 to 15 weight percent based on weight of the curable silicone composition;
wherein the curable organosiloxane composition comprises at least one diorganosiloxane compound, a catalyst, and an adhesion promoter; wherein the at least one diorganosiloxane compound has on average per molecule at least one reactive moiety, wherein each reactive moiety independently is an alkenyl moiety, Si—H moiety, Si—OH moiety, Si—OR moiety, wherein R is $(C_1-C_{10})$hydrocarbyl, —C(O)$(C_1-C_{10})$hydrocarbyl, or —N═CR$^1$ R$^2$, wherein each of R$^1$ and R$^2$ independently is $(C_1-C_{10})$hydrocarbyl or R$^1$ and R$^2$ are taken together to form a $(C_2-C_{10})$hydrocarbylene; and wherein the at least one diorganosiloxane compound is at least 50 weight percent of the curable organosiloxane composition;
wherein the concentration of silver particles is from 42 to 55 weight percent, the concentration of silver-coated core particles is from 15 to 25 weight percent, and the total concentration of silver is from 50.5 to 59.4 weight percent, all based on weight of the curable silicone composition;
wherein the concentration of silver in the silver-coated core particles is from 2 to 58 weight percent based on weight of the silver-coated core particles;
wherein the concentration of carbon nanotubes is from 0.1 to 2.9 weight percent based on weight of the curable silicone composition;
wherein the curable silicone composition is characterized by a Thixotropic Index($\eta_1/\eta_{10}$) of from 3 to 10 measured according to TI Test Method; and
wherein the curable silicone composition is characterized by a volume resistivity less than 0.0010 Ohm-centimeter measured according to the Volume Resistivity Test Method.

13. The curable silicone composition of claim 11 characterized by the following limitations:
wherein the hydrocarbon vehicle is an alkanes mixture;
wherein the curable organosiloxane composition comprises at least one diorganosiloxane compound, at least one organohydrogensilicon compound, a hydrosilylation catalyst, and an epoxy-functional adhesion promoter; wherein the at least one diorganosiloxane compound has on average per molecule at least 1 alkenyl moiety and the organohydrogensilicon compound has on average per molecule at least 1 Si—H moiety; and wherein the at least one diorganosiloxane compound is from 60 to 80 wt % of the curable organosiloxane composition;
wherein the concentration of silver particles is from 45 to 55 weight percent, the concentration of silver-coated core particles is from 16 to 22 weight percent, and the total concentration of silver is from 50.7 to 59.4 weight percent, all based on weight of the curable silicone composition;
wherein the concentration of silver in the silver-coated core particles is from 10 to 45 weight percent based on weight of the silver-coated core particles;
wherein the carbon nanotubes are single-walled carbon nanotubes, multi-walled carbon nanotubes, derivatized carbon nanotubes, or a combination of any two or more of the single-walled carbon nanotubes, multi-walled carbon nanotubes, and derivatized carbon nanotubes; and the concentration of carbon nanotubes is from 0.4 to 2.5 weight percent based on weight of the curable silicone composition; and
wherein the curable silicone composition is characterized by a volume resistivity less than 0.00090 Ohm-centimeter measured according to Volume Resistivity Test Method.

14. The curable silicone composition of claim 13 characterized by the following limitations:

wherein the alkanes mixture is an isoalkanes mixture comprising at least two of ($C_9$-$C_{12}$)isoalkanes, at least two of ($C_{12}$-$C_{16}$)isoalkanes or at least two of ($C_{16}$-$C_{22}$) isoalkanes and the hydrocarbon vehicle is at a concentration of from 5 to 14 weight percent based on weight of the curable silicone composition;

wherein the curable organosiloxane composition is hydrosilylation curable and comprises the at least one alkenyl-substituted diorganosiloxane compound, the at least one trimethylsiloxy-terminated dimethyl organohydrogensilicon compound, a microencapsulated hydrosilylation catalyst, and a bis(alpha,omega-glycidoxyalkyl)-dialkyl/(alkyl,alkenyl)siloxane adhesion promoter; wherein the alkenyl of the diorganosiloxane is vinyl and the at least one diorganosiloxane compound has on average per molecule at least 1.1 vinyl moieties, the at least one trimethylsiloxy-terminated dimethyl organohydrogensilicon compound is has on average per molecule at least 1.1 Si—H moieties, or the least one diorganosiloxane compound has on average per molecule at least 1.1 vinyl moieties and the at least one organohydrogensilicon compound has on average per molecule at least 1.1 Si—H moieties; wherein the at least one diorganosiloxane compound having vinyl moieties is from 70 to 78 wt % of the curable organosiloxane composition; wherein the at least one organohydrogensilicon compound is from 1 to 5 weight percent, the microencapsulated hydrosilylation catalyst is from 10 to 15 weight percent, and the bis(alpha,omega-glycidoxyalkyl)-dialkyl/(alkyl,alkenyl)siloxane adhesion promoter is from 0.1 to 10 weight percent, and together the organohydrogensilicon compound, microencapsulated hydrosilylation catalyst, and the bis(alpha,omega-glycidoxyalkyl)-dialkyl/(alkyl,alkenyl)siloxane adhesion promoter are from 20 to 30 wt % of the curable organosiloxane composition;

wherein the concentration of silver particles is from 48 to 52 weight percent, the concentration of silver-coated core particles is from 16 to 20 weight percent, and the total concentration of silver is from 54 to 59.0 weight percent, all based on weight of the curable silicone composition;

wherein the concentration of silver in the silver-coated core particles is from 12 to 43 weight percent based on weight of the silver-coated core particles;

wherein the silver-coated core particles wherein the core is aluminum; silica glass; carbon; a ceramic; copper; iron; lithium; molybdenum; nickel; organic polymer; palladium; platinum; silica; tin; tungsten; zinc; or a metal alloy of any two or more of aluminum, copper, iron, lithium, molybdenum, nickel, palladium, platinum, tin, tungsten, and zinc; or a physical blend of any two or more of aluminum; silica glass; carbon; a ceramic; copper; iron; lithium; molybdenum; nickel; organic polymer; palladium; platinum; silica; tin; tungsten; zinc; and the metal alloy;

wherein the concentration of the carbon nanotubes is from 0.6 to 2.3 weight percent based on weight of the curable silicone composition; and wherein the curable silicone composition is characterized by a volume resistivity of less than 0.00080 Ohm-centimeter measured according to the Volume Resistivity Test Method.

15. A curable silicone composition comprising a blend of the following ingredients:

an isoalkanes mixture comprising at least three of ($C_{12}$-$C_{16}$)isoalkanes and wherein the lowest boiling isoalkanes molecules have an initial boiling point of greater than 210 degrees Celsius and the highest boiling isoalkanes molecules have an end boiling point of less than 270 degrees Celsius and the hydrocarbon vehicle is at a concentration of from 6 to 11 weight percent based on weight of the curable silicone composition;

a hydrosilylation-curable polydimethylsiloxane composition comprising at least one vinyl-functional polydimethylsiloxane compound having on average per molecule at least 1 vinyl moieties, at least one trimethylsiloxy-terminated dimethyl methylhydrogensilicon compound having on average per molecule at least 1.1 Si—H moieties, a microencapsulated platinum hydrosilylation catalyst, bis(alpha,omega-glycidoxyalkyl-D3 to D6 alkyl,hydrogencyclosiloxane), and bis(alpha,omega-glycidoxyalkyl)-dialkyl/(alkyl,alkenyl) siloxane adhesion promoter; and wherein the vinyl-functional polydimethylsiloxane compound is from 70 to 78 weight percent of the hydrosilylation-curable polydimethylsiloxane composition, the trimethylsiloxy-terminated dimethyl methylhydrogensilicon compound is from 1 to 5 weight percent of the hydrosilylation-curable polydimethylsiloxane composition, the microencapsulated hydrosilylation catalyst is from 10 to 15 weight percent of the hydrosilylation-curable polydimethylsiloxane composition, the bis(alpha,omega-glycidoxyalkyl-D3 to D6 alkyl,hydrogencyclosiloxane) is from 0 to 7 weight percent of the hydrosilylation-curable polydimethylsiloxane composition, and the bis(alpha,omega-glycidoxyalkyl) -dialkyl/(alkyl,alkenyl)siloxane adhesion promoter is from 1 to 10 weight percent of the hydrosilylation-curable polydimethylsiloxane composition; and wherein together the trimethylsiloxy-terminated dimethyl methylhydrogensilicon compound, microencapsulated hydrosilylation catalyst, bis(alpha,omega-glycidoxyalkyl-D3 to D6 alkyl,hydrogencyclosiloxane), and the bis(alpha,omega-glycidoxyalkyl)-dialkyl/(alkyl,alkenyl)siloxane adhesion promoter are from 20 to 30 wt % of the hydrosilylation-curable polydimethylsiloxane composition; and electrically conductive filler consisting essentially of a combination of silver particles, silver-coated nickel particles, and multi-walled carbon nanotubes; wherein the silver particles are silver flakes, and wherein the concentration of silver flakes is from 40 to 51 weight percent, the concentration of silver-coated nickel particles is from 17 to 32 weight percent, and the total concentration of silver is from 54.0 to 59.0 weight percent, all based on weight of the curable silicone composition; wherein the concentration of silver in the silver-coated nickel particles is from 28 to 42 weight percent based on weight of the silver-coated nickel particles; and wherein the multi-walled carbon nanotubes are at a concentration of from 0.3 to 2.2 weight percent based on weight of the curable silicone composition;

wherein the curable silicone composition is characterized by a Thixotropic Index($\eta_1/\eta_{10}$) of from 3 to 7 measured according to TI Test Method; and wherein the curable silicone composition is characterized by a volume resistivity of less than 0.00070 Ohm-centimeter measured according to Volume Resistivity Test Method.

* * * * *